(12) United States Patent
Oshima et al.

(10) Patent No.: US 9,048,420 B2
(45) Date of Patent: Jun. 2, 2015

(54) POWER GENERATION UNIT, ELECTRONIC APPARATUS, TRANSPORTATION DEVICE, AND METHOD OF CONTROLLING POWER GENERATION UNIT

(71) Applicant: SEIKO EPSON CORPORATION, Tokyo (JP)

(72) Inventors: Atsushi Oshima, Shiojiri (JP); Kunio Tabata, Shiojiri (JP); Hiroyuki Yoshino, Suwa (JP); Noritaka Ide, Shiojiri (JP); Atsuya Hirabayashi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 443 days.

(21) Appl. No.: 13/633,197

(22) Filed: Oct. 2, 2012

(65) Prior Publication Data

US 2013/0082572 A1    Apr. 4, 2013

(30) Foreign Application Priority Data

Oct. 3, 2011  (JP) .................................. 2011-219049
Jul. 6, 2012   (JP) .................................. 2012-152628

(51) Int. Cl.
   *H02N 2/18*    (2006.01)
   *H01L 41/113*  (2006.01)

(52) U.S. Cl.
   CPC ............ *H01L 41/1136* (2013.01); *H02N 2/181* (2013.01); *H02N 2/188* (2013.01)

(58) Field of Classification Search
   CPC ....... H02N 2/18; F23Q 3/002; H01L 41/1136
   USPC .......................... 310/330, 331, 332, 339, 319
   See application file for complete search history.

(56) References Cited

U.S. PATENT DOCUMENTS

| | | |
|---|---|---|
| 5,552,656 A | 9/1996 | Taylor |
| 5,801,475 A | 9/1998 | Kimura |
| 6,252,336 B1 * | 6/2001 | Hall ............................. 310/339 |

(Continued)

FOREIGN PATENT DOCUMENTS

| | | |
|---|---|---|
| JP | 07-107752 A | 4/1995 |
| JP | 2005-312269 A | 11/2005 |

(Continued)

OTHER PUBLICATIONS

E. Lefeuvre et al., "A comparison between several vibration-powered piezoelectric generators for standalone systems", Sensors and Actuators A: Physical, vol. 126, Issue 2, Feb. 14, 2006, pp. 405-416.

*Primary Examiner* — Derek Rosenau
*Assistant Examiner* — Bryan Gordon
(74) *Attorney, Agent, or Firm* — Maschoff Brennan

(57) ABSTRACT

A power generation unit includes a beam (a deforming member) having a piezoelectric element and deforming while switching a deformation direction, an inductor electrically connected to the piezoelectric element, a switch disposed between the piezoelectric element and the inductor, a memory (a storage section) adapted to store switching period information (information of a characteristic vibration period of the beam), and a control circuit (a control section) adapted to control one of a timing at which the switch is set to a conductive state and a timing at which the switch is set to a nonconductive state in accordance with the switching period information stored in the memory.

19 Claims, 23 Drawing Sheets

(56) References Cited

U.S. PATENT DOCUMENTS

| | | | |
|---|---|---|---|
| 6,462,461 B1* | 10/2002 | Puskas | 310/323.01 |
| 6,522,048 B1 | 2/2003 | Burns et al. | |
| 6,552,048 B2* | 4/2003 | Kirsch et al. | 514/331 |
| 8,026,650 B2 | 9/2011 | Ramadass et al. | |
| 8,368,290 B2 | 2/2013 | Kwon et al. | |
| 8,373,332 B2 | 2/2013 | Lee | |
| 2005/0105231 A1* | 5/2005 | Hamel et al. | 361/90 |
| 2009/0167798 A1* | 7/2009 | Ide et al. | 347/10 |
| 2010/0102782 A1 | 4/2010 | Thiesen et al. | |
| 2011/0016973 A1* | 1/2011 | Hamatani et al. | 73/514.29 |
| 2011/0285131 A1* | 11/2011 | Kwon et al. | 290/50 |
| 2012/0119618 A1* | 5/2012 | Tabata et al. | 310/319 |
| 2012/0126666 A1 | 5/2012 | Tabata et al. | |
| 2012/0280596 A1 | 11/2012 | Ide et al. | |

FOREIGN PATENT DOCUMENTS

| | | |
|---|---|---|
| JP | 4835888 B1 | 12/2011 |
| JP | 4835889 B1 | 12/2011 |

* cited by examiner

DEFORMATION DIRECTION

DOWNWARD MAXIMUM DEFORMATION

DOWNWARD MAXIMUM DEFORMATION

DOWNWARD MAXIMUM DEFORMATION

DOWNWARD MAXIMUM DEFORMATION

DOWNWARD MAXIMUM DEFORMATION

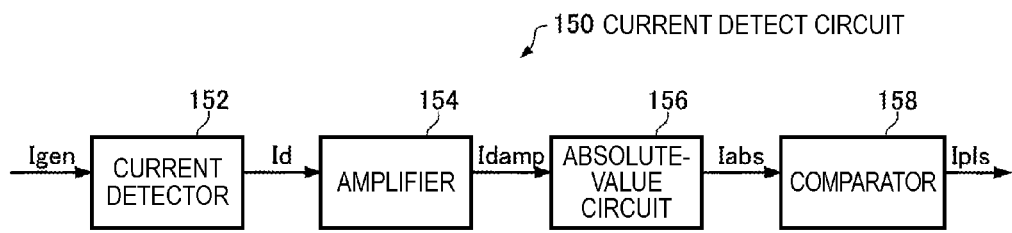
FIG.14
FIG.15A
FIG.15B
FIG.15C
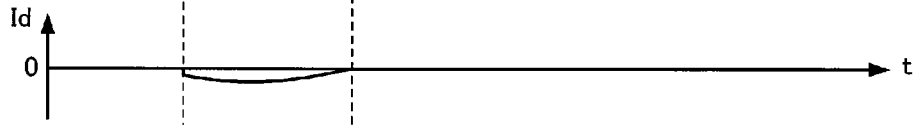
FIG.15D
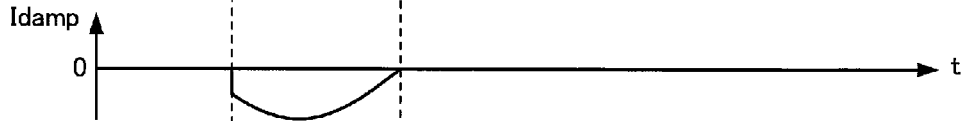
FIG.15E
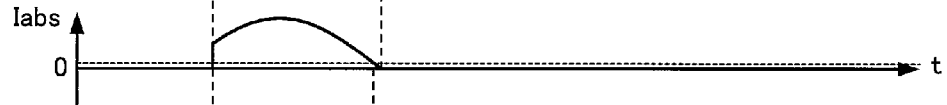
FIG.15F
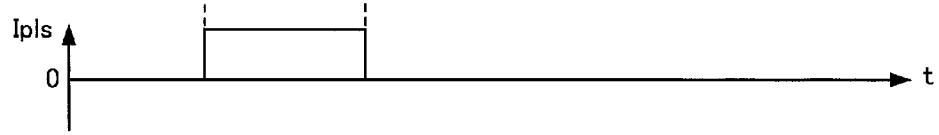

POWER GENERATION UNIT, ELECTRONIC APPARATUS, TRANSPORTATION DEVICE, AND METHOD OF CONTROLLING POWER GENERATION UNIT

BACKGROUND

1. Technical Field

The present invention relates to a power generation unit for taking out the charge, which is generated when a piezoelectric material such as of a piezoelectric element is deformed, as electrical energy, an electronic apparatus and a transportation device using the power generation unit, and a method of controlling the power generation unit.

2. Related Art

When a piezoelectric material such as lead zirconium titanate (PZT), quartz crystal ($SiO_2$), or zinc oxide (ZnO) is deformed in response to an external force, electrical polarization is induced inside the material, and positive and negative charges appear on the surfaces. Such a phenomenon is called a so-called piezoelectric effect. There has been proposed an electrical power generation method of vibrating a cantilever to thereby make a weight repeatedly act on the piezoelectric material, and thus taking out the charge generated on the surface of the piezoelectric material as electricity using such a characteristic provided to the piezoelectric material.

For example, by vibrating a metal cantilever having a mass disposed at the tip and a thin plate made of the piezoelectric material bonded thereto, and taking out the positive and negative charges alternately generated on the piezoelectric material due to the vibration, an alternating current is generated. Then, the alternating current is rectified by diodes, and then stored in a capacitor, and then taken out as electricity. Such a technology has been proposed in JP-A-7-107752. Further, there has been also proposed a technology of arranging that a junction is closed only during the period in which the positive charges are generated in a piezoelectric device to thereby make it possible to obtain a direct current without causing a voltage loss in the diodes (JP-A-2005-312269). Since it is possible to miniaturize the power generation unit by using these technologies, there is expected an application of, for example, incorporating the power generation unit in, for example, a small-sized electronic component instead of a battery.

However, in the proposed technology according to the related art, there arises a problem that the obtainable voltage is limited up to the voltage generated by the electrical polarization of the piezoelectric material. Therefore, there arises a problem that a step-up circuit is required separately from the power generation circuit for taking out the electricity from the piezoelectric material in many cases, and it is difficult to sufficiently miniaturize the power generation unit.

SUMMARY

An advantage of some aspects of the invention is to provide a technology capable of generating a high voltage without growing the power generation unit using the piezoelectric effect of the piezoelectric material in size.

(1) An aspect of the invention is directed to a power generation unit including a deforming member having a piezoelectric element and deforming while switching a deformation direction, an inductor electrically connected to the piezoelectric element, a switch disposed between the piezoelectric element and the inductor, a storage section adapted to store information including at least one of a characteristic vibration period, a dimension, and a weight of the deforming member, and a control section adapted to control one of a timing at which the switch is set to a conductive state and a timing at which the switch is set to a nonconductive state in accordance with the information stored in the storage section.

The information of the characteristic vibration period of the deforming member denotes the information capable of specifying the characteristic vibration period of the deforming member, and can be the information directly representing the characteristic vibration period of the deforming member, or can be the information capable of indirectly specifying the characteristic vibration period of the deforming member. The information of the dimension of the deforming member denotes the information of, for example, the length and the thickness of the deforming member. The information of the dimension and the weight of the deforming member is the information of the factors for determining the characteristic vibration period of the deforming member, and the information capable of indirectly specifying the characteristic vibration period of the deforming member.

According to this aspect of the invention, since the piezoelectric element is provided to the deforming member, if the deforming member deforms, the piezoelectric element also deforms. Therefore, positive and negative charges are generated in the piezoelectric element due to the piezoelectric effect. Further, the generation amount of the charge increases as the deformation amount of the deforming member (i.e., the deformation amount of the piezoelectric element) increases. Further, since the piezoelectric element can be regarded as a capacitor from a viewpoint of an electrical circuit, by connecting the switch, the resonant circuit composed of the piezoelectric element and the inductor is formed, and the charge generated in the piezoelectric element flows from one electrode of the piezoelectric element into the inductor. Then, the current having flown into the inductor overshoots it, and flows into the piezoelectric element from the other electrode of the piezoelectric element. Therefore, by connecting the piezoelectric element and the inductor to each other, and then disconnecting the inductor from the piezoelectric element at a predetermined timing, locations of the positive and negative charges having been generated in the piezoelectric element before connecting the inductor can be reversed. Then, by deforming the deforming member (the piezoelectric element) in the opposite direction in turn in that state, the charges generated due to the piezoelectric effect can be stored in the piezoelectric element. Therefore, by repeatedly deforming the deforming member (the piezoelectric element) to thereby periodically perform the connection/disconnection between the piezoelectric element and the inductor in sync with the deformation state (the vibration state) of the deforming member, it becomes possible to store the charges in the piezoelectric element. In particular, according to this aspect of the invention, by controlling the timing at which the switch is set to the conductive state or the timing at which the switch is set to the nonconductive state in accordance with the information including at least one of the characteristic vibration period, the dimension, and the weight of the deforming member, the connection/disconnection between the piezoelectric element and the inductor can periodically be repeated at the timing synchronous with the deformation state (the vibration state) of the deforming member, and therefore, it becomes possible to store the charges in the piezoelectric element. Further, since the voltage between the electrodes of the piezoelectric element increases in accordance with the charge accumulated in the piezoelectric element, it is possible to generate a voltage higher than the voltage generated due to the electrical polarization of the piezoelectric material without additionally preparing a step-up circuit. As a result, it becomes possible to obtain a small-sized and efficient power generation unit.

(2) The power generation unit according to the above aspect of the invention may be configured such that the power generation unit further includes a vibration detection section adapted to detect a state of a vibration of the deforming member, and the control section performs one of a process of determining the timing at which the switch is set to the conductive state based on a detection result of the vibration detection section, and then setting the switch to the conductive state at a timing corresponding to the information stored in the storage section, and a process of determining the timing at which the switch is set to the nonconductive state based on the detection result of the vibration detection section, and then setting the switch to the nonconductive state at the timing corresponding to the information stored in the storage section.

According to this configuration, by detecting the state of the vibration of the deforming member, and determining the timing at which the switch is set to the conductive state or the nonconductive state based on the detection result, the timing at which the connection/disconnection between the piezoelectric element and the inductor is performed can be adjusted to an appropriate timing. Further, after determining the timing at which the switch is set to the conductive state or the nonconductive state, by setting the switch to the conductive state or the nonconductive state at the timing corresponding to the information of, for example, the characteristic vibration period of the deforming member, the connection/disconnection between the piezoelectric element and the inductor can periodically be repeated at an appropriate timing synchronous with the deformation state (the vibration state) of the deforming member, and therefore, it becomes possible to efficiently store the charges in the piezoelectric element.

(3) The power generation unit according to the above aspect of the invention may be configured such that the control section performs one of a process of setting the switch to the conductive state at a timing at which the deformation direction of the deforming member is switched based on a detection result of the vibration detection section, and then setting the switch to the conductive state at the timing corresponding to the information stored in the storage section, and a process of setting the switch to the nonconductive state, and then setting the switch to the nonconductive state at the timing corresponding to the information stored in the storage section if the deformation direction of the deforming member fails to be switched based on the detection result of the vibration detection section.

Since the voltage generated by the piezoelectric element reaches a peak at the timing at which the deformation direction of the deforming member is switched, by connecting the switch at this timing to thereby form the resonant circuit, or by disconnecting the switch except the timing at which the deformation direction of the deforming member is switched, it is possible to efficiently step up the voltage between the electrodes of the piezoelectric element. Therefore, according to the power generation unit, the power generation efficiency can be improved.

(4) The power generation unit according to the above aspect of the invention may be configured such that the power generation unit further includes a rectifier disposed between the piezoelectric element and the inductor, and adapted to rectify a current generated by the piezoelectric element, and the vibration detection section detects a current flowing from the piezoelectric element to the rectifier.

Since the locations of the positive and negative charges stored in the piezoelectric element are periodically changed in accordance with the deformation (the vibration) of the deforming member, the voltage between the electrodes of the piezoelectric element is also changed periodically. Further, the current flows through the rectifier only during the period in which the voltage between the electrodes of the piezoelectric element is higher than the voltage between the both terminals of a load connected thereto via the rectifier. Therefore, by detecting the current flowing through the rectifier, the state of the vibration of the deforming member can be detected.

In particular, the timing at which the deformation direction of the deforming member coincides with the timing (the timing at which the current vanishes) at which the direction of the current due to the charge generated by the piezoelectric element is switched. In other words, the current having been flowing in the rectifier stops when the deformation direction of the deforming member is switched. Therefore, it is also possible to arrange that the control section connects the switch when the current stops flowing from the piezoelectric element to the rectifier based on the detection result of the vibration detection section, and then disconnects the switch when a predetermined period has elapsed. According to this configuration, by connecting the switch to thereby form the resonant circuit at the timing at which the voltage generated by the piezoelectric element reaches the peak, the voltage between the electrodes of the piezoelectric element can efficiently be stepped up, and the power generation efficiency can be improved.

(5) The power generation unit according to the above aspect of the invention may be configured such that the power generation unit further includes a second piezoelectric element, which is different from the piezoelectric element (hereinafter also referred to as a first piezoelectric element), and is provided to the deforming member, and a pair of electrodes provided to the second piezoelectric element, and the vibration detection section detects a voltage between the pair of electrodes provided to the second piezoelectric element.

According to the power generation unit of this configuration, since the second piezoelectric element is provided to the deforming member, if the deforming member deforms, the second piezoelectric element also deforms. Therefore, positive and negative charges are generated in the second piezoelectric element due to the piezoelectric effect. Further, the generation amount of the charge increases as the deformation amount of the deforming member (i.e., the deformation amount of the second piezoelectric element) increases. Specifically, since the locations of the positive and negative charges stored in the second piezoelectric element are periodically changed in accordance with the deformation (the vibration) of the deforming member, the voltage between the pair of electrodes provided to the second piezoelectric element is also changed periodically. Therefore, by detecting the voltage between the pair of electrodes provided to the second piezoelectric element, the state of the vibration of the deforming member (the first piezoelectric element) can be detected.

In particular, at the timing at which the deformation direction of the deforming member is switched, the voltage generated by the first piezoelectric element reaches the peak, and at the same time the voltage generated by the second piezoelectric element reaches the peak. Therefore, it is also possible to arrange that the control section connects the switch when the voltage between the electrodes of the second piezoelectric element reaches the peak based on the detection result of the vibration detection section, and then disconnects the switch when a predetermined period has elapsed. According to this configuration, by connecting the switch to thereby form the resonant circuit at the timing at which the voltage generated by the first piezoelectric element reaches the peak, the voltage between the electrodes of the first piezoelectric element can efficiently be stepped up, and the power generation efficiency can be improved.

(6) The power generation unit according to the above aspect of the invention may be configured such that the vibration detection section detects a state of the vibration of the deforming member in an initial operation of the power generation unit.

According to this configuration, since the timing at which the switch is connected can be adjusted to be an appropriate timing based on the vibration state of the deforming member when the power generation unit starts the power generation operation, the power generation efficiency can be improved.

(7) The power generation unit according to the above aspect of the invention may be configured such that the vibration detection section detects a state of the vibration of the deforming member at a timing at which an event signal is input from an outside of the power generation unit.

According to this configuration, since the timing at which the switch is connected can be adjusted to be an appropriate timing based on the vibration state of the deforming member when the event signal externally input, the power generation efficiency can be improved.

(8) The power generation unit according to the above aspect of the invention may be configured such that the vibration detection section detects the state of the vibration of the deforming section again when a predetermined period has elapsed after the state of the vibration of the deforming member is detected.

According to this configuration, since the timing at which the switch is connected can be adjusted again to be an appropriate timing based on the vibration state of the deforming member when a predetermined period has elapsed after detecting the state of the vibration of the deforming member, the power generation efficiency can be improved. In particular, if the information of, for example, the characteristic vibration period stored in the storage section is slightly different from the actual characteristic vibration period of the deforming member, the timing at which the switch is connected is slowly shifted from the appropriate timing over time. According to the power generation unit of the configuration described above, this shift can be corrected when the predetermined period elapses.

(9) The power generation unit according to the above aspect of the invention may be configured such that the control section measures the vibration period of the deforming member based on the detection result of the vibration detection section, and then updates the information of the characteristic vibration period stored in the storage section based on the measurement result.

Although it is possible that the characteristic vibration period of the deforming member slowly varies due to the time degradation, according to the power generation unit of the configuration described above, it is possible to appropriately update the information of the characteristic vibration period stored in the storage section in accordance with the vibration period of the deforming member at that moment. Thus, even if the power generation unit is used for a long period of time, the deterioration of the power generation efficiency can be prevented.

(10) The power generation unit according to the above aspect of the invention may be configured such that the control section sets the switch to the conductive state for a period corresponding to a half cycle of a resonance period of a resonant circuit configured including a capacitive component of the piezoelectric element and the inductor.

The period until the charge having flown out from one electrode of the piezoelectric element flows again into the piezoelectric element through the other electrode via the inductor corresponds to a half of the resonance period of the resonant circuit composed of the piezoelectric element and the inductor. Therefore, by connecting the switch and then disconnecting the switch at the timing when the period half as long as the resonance period has elapsed, the locations of the positive and negative charges generated in the piezoelectric element can be reversed with the highest efficiency. Therefore, according to the power generation unit of the configuration described above, it is possible to realize the highest power generation efficiency.

(11) Another aspect of the invention is directed to an electronic apparatus including any one of the power generation units described above.

(12) Still another aspect of the invention is directed to a transportation device including any one of the power generation units described above.

According to these aspects of the invention, since it is possible to incorporate the power generation unit in the small-sized electronic apparatus such as a remote controller instead of a battery, the power can be generated due to the transportation of the small-sized electronic apparatus, and in addition, by using the power generation unit according to the aspect of the invention in a transportation device such as a vehicle or a electric train, it is also possible to generate electricity by the vibration due to the transportation, and to efficiently supply the electricity to the equipment provided to the transportation device.

(13) Yet another aspect of the invention is directed to a method of controlling a power generation unit including a power generation unit including a deforming member having a piezoelectric element and deforming while switching a deformation direction, an inductor electrically connected to the piezoelectric element, a switch disposed between the piezoelectric element and the inductor, and a storage section adapted to store information including at least one of a characteristic vibration period, a dimension, and a weight of the deforming member. The method includes controlling one of a timing at which the switch is set to a conductive state and a timing at which the switch is set to a nonconductive state in accordance with the information stored in the storage section.

According to this aspect of the invention, by setting the switch to the conductive state or the nonconductive state in accordance with the information including at least one of the characteristic vibration period, the dimension, and the weight of the deforming member, the connection/disconnection between the piezoelectric element and the inductor can periodically be repeated at the timing synchronous with the deformation state (the vibration state) of the deforming member (the piezoelectric element), and therefore, it becomes possible to store the charges in the piezoelectric element. Further, since the voltage between the electrodes of the piezoelectric element increases in accordance with the charge accumulated in the piezoelectric element, it is possible to generate a voltage higher than the voltage generated due to the electrical polarization of the piezoelectric material without additionally preparing a step-up circuit.

BRIEF DESCRIPTION OF THE DRAWINGS

The invention will be described with reference to the accompanying drawings, wherein like numbers reference like elements.

FIG. 14 is a diagram showing a configuration example of a current detect circuit.

FIGS. 15A through 15F are diagrams showing output waveform examples of respective parts of the current detect circuit.

DESCRIPTION OF EXEMPLARY EMBODIMENTS

Hereinafter, some preferred embodiments of the invention will be described in detail with reference to the accompanying drawings. It should be noted that the embodiments described below do not unreasonably limit the content of the invention as set forth in the appended claims. Further, all of the constituents described below are not necessarily essential elements of the invention.

Hereinafter, embodiments of the invention will be explained along the following order to thereby clarify the content of the invention described above.

Figure 1A:
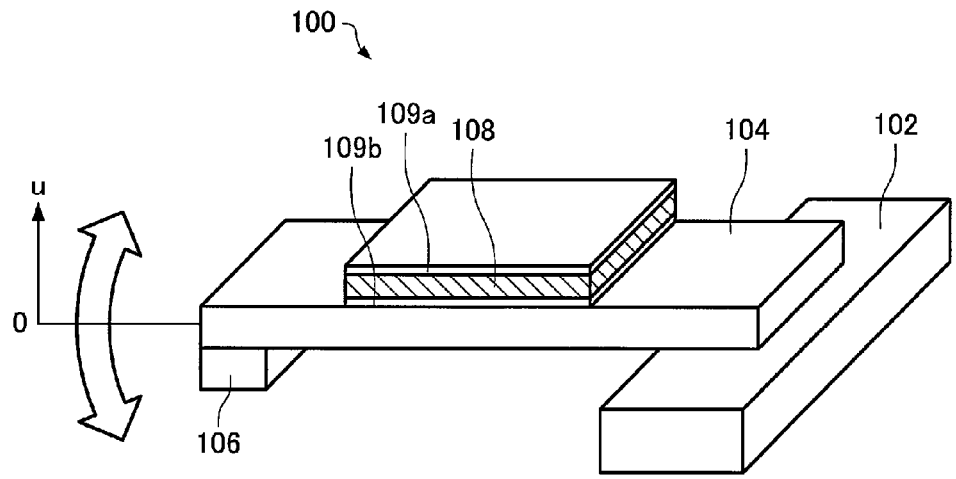
FIGS. 1A and 1B are explanatory diagrams showing a structure of a power generation unit according to a first embodiment of the invention.
Figure 1B:
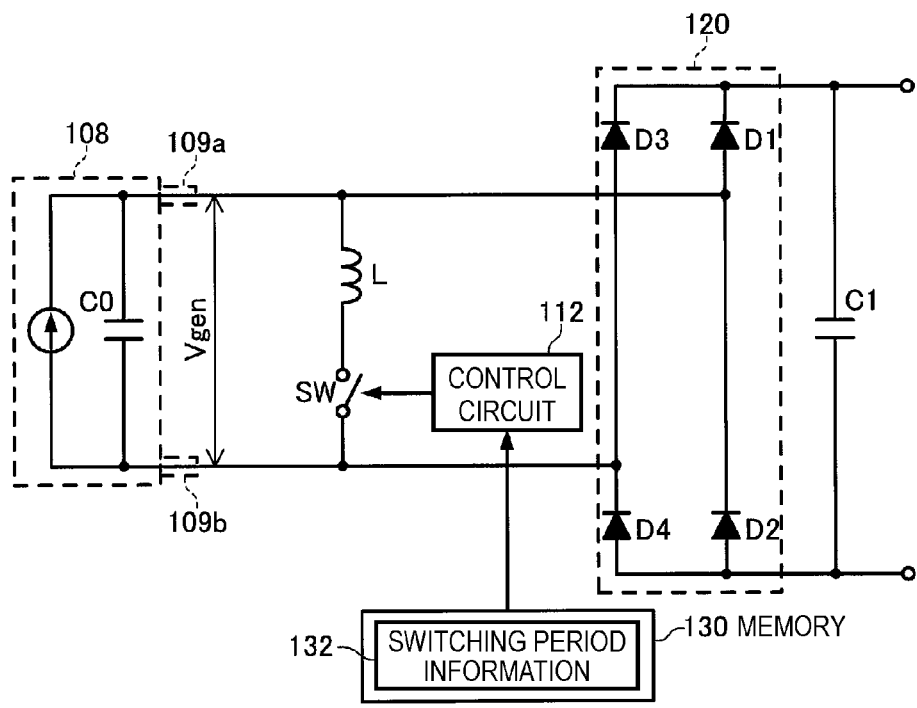

A. First Embodiment
A-1. Structure of Power Generation Unit
A-2. Operation of Power Generation Unit
A-3. Operation Principle of Power Generation Unit
A-4. Switching Timing of Switch
B. Second Embodiment
C. Third Embodiment
D. Fourth Embodiment
E. Fifth Embodiment
F. Modified Examples
F-1. First Modified Example
F-2. Second Modified Example
F-3. Third Modified Example
F-4. Fourth Modified Example
F-5. Fifth Modified Example A. First Embodiment A-1. Structure of Power Generation Unit FIGS. 1A and 1B are explanatory diagrams showing a structure of a power generation unit 100 according to the present embodiment. FIG. 1A shows a mechanical structure of the power generation unit 100, and FIG. 1B shows an electrical structure thereof. The mechanical structure of the power generation unit 100 according to the present embodiment is formed as a cantilever structure in which a beam 104 having a mass 106 disposed at the tip thereof is fixed to a base 102 on the base end side thereof, and the base 102 is preferably fixed inside the power generation unit 100. Further, on the surface of the beam 104 there is attached a piezoelectric element 108 formed of a piezoelectric material such as lead zirconium titanate (PZT), and on the surfaces of the piezoelectric element 108 there are disposed a first electrode (an upper electrode) 109a and a second electrode (a lower electrode) 109b each formed of a metal thin film respectively on the obverse side and the reverse side. It should be noted that although in the example shown in FIG. 1A, the piezoelectric element 108 is disposed on the upper surface side of the beam 104, it is also possible to dispose the piezoelectric element 108 on the lower surface side of the beam 104, or it is also possible to dispose the piezoelectric elements 108 on both of the upper surface side and the lower surface side of the beam 104.

Since the beam 104 is fixed to the base 102 at the base end side thereof, and has the mass 106 disposed on the tip side thereof, when a vibration or the like is applied to the beam 104, the tip of the beam 104 vibrates with a large amplitude as indicated by the outlined arrow in the drawing. As a result, a compressive force and a tensile force alternately act on the piezoelectric element 108 attached to the surface of the beam 104. Then, the piezoelectric element 108 generates positive and negative charges due to the piezoelectric effect, and the charges appear in the first electrode 109a and the second electrode 109b. Further, although the mass 106 is not essential, it is desirable to create imbalance in mass between the tip side and the base end side of the beam 104. This is because the displacement of the beam 104 becomes easy to repeat in response to one vibration, for example, due to the imbalance in mass. It should be noted that the beam 104 corresponds to a "deforming member" according to the invention.

FIG. 1B shows an example of a circuit diagram of the power generation unit 100 according to the present embodiment. The piezoelectric element 108 can electrically be expressed as a current source and a capacitor (a capacitive component) CO for storing a charge. An inductor L is connected in parallel to the piezoelectric element 108 to thereby form an electrical resonant circuit together with the capacitive component of the piezoelectric element 108. Further, a switch SW for switching ON/OFF the resonant circuit is connected in series to the inductor L.

A control circuit 112 controls the timing for setting the switch SW to the ON/OFF states. Specifically, the control circuit 112 sets the switch SW to the ON state with a predetermined period set in switching period information 132 stored in a memory (a storage section) 130, and then set the switch SW to the OFF state when a predetermined period has elapsed. The switching period information 132 can be numerical information of the period or the frequency for switching the switch SW, or can be an initial value or an upper limit value of a timer for counting a predetermined period. In the present embodiment, a period coinciding with the characteristic vibration period of the beam 104 is set as the switching period information 132. It should be noted that it is also possible to store the information, with which the characteristic vibration period of the beam 104 can indirectly be specified such as the information of the factors determining the characteristic vibration period of the beam 104 such as the length, the thickness, the weight of the beam 104, or the weight of the mass 106, in the memory 130 instead of or together with the switching period information 132 directly representing the characteristic vibration period of the beam 104, and to calculate the initial value or the upper limit value of the timer based on at least one of these pieces of information. Further, it is also possible to arrange that a plurality of pieces of switching period information 132 having the respective values different from each other is stored in the memory 130, and an appropriate one of the predetermined periods is selected in accordance with the individual difference or the temporal characteristic variation of the beam 104 to be installed therein.

Further, the first electrode 109a and the second electrode 109b provided to the piezoelectric element 108 are connected to a full bridge rectifier 120 composed of four diodes D1 through D4. Further, a capacitor (an output capacitor) C1 for storing the current after the rectification for driving an electrical load is connected to the full bridge rectifier 120.

A-2. Operation of Power Generation Unit

Figure 2A:
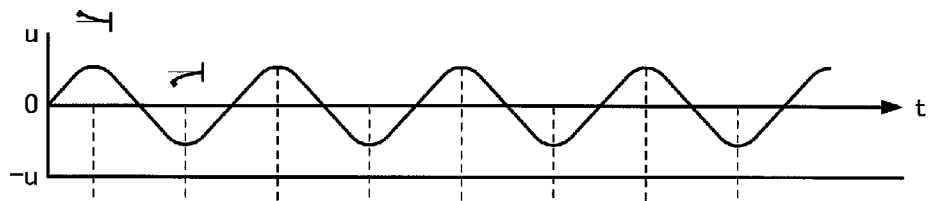
FIGS. 2A through 2D are explanatory diagrams showing an operation of the power generation unit according to the first embodiment.
Figure 2B:
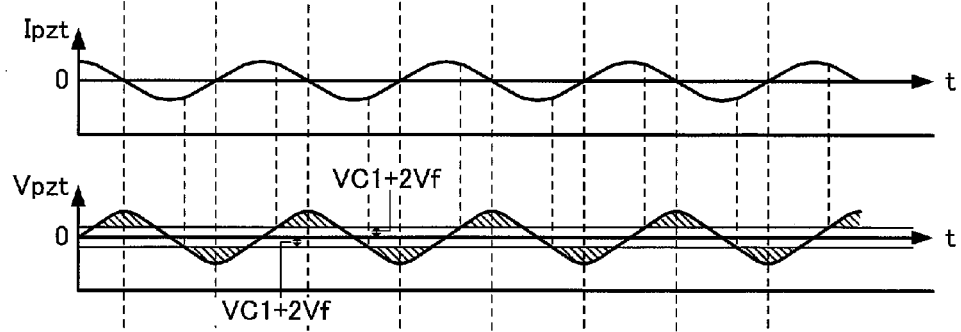

FIGS. 2A through 2D are explanatory diagrams showing the operation of the power generation unit 100 according to the present embodiment. FIG. 2A shows how the displacement u of the tip of the beam 104 varies due to the vibration of the beam 104. It should be noted that the positive displacement u represents the state (the state in which the upper surface side of the beam 104 has a concave shape) in which the beam 104 is warped upward, and the negative displacement (-u) represents the state (the state in which the lower surface side of the beam 104 has a concave shape) in which the beam 104 is warped downward. Further, FIG. 2B shows the state of the current generated by the piezoelectric element 108 due to the deformation of the beam 104 and the electromotive force caused inside the piezoelectric element 108 as a result thereof. It should be noted that in FIG. 2B the state of the charge generated in the piezoelectric element 108 is expressed as an amount of the charge (i.e., a current Ipzt) generated per unit time, and the electromotive force generated in the piezoelectric element 108 is expressed as the electrical potential difference Vpzt generated between the first electrode 109a and the second electrode 109b.

As shown in FIGS. 2A and 2B, during the period in which the displacement of the beam 104 keeps increasing, the piezoelectric element 108 generates a current in the positive direction (i.e., the current Ipzt takes a positive value), and the electrical potential difference Vpzt between the first electrode 109a and the second electrode 109b increases in the positive direction in conjunction therewith. If the electrical potential difference Vpzt in the positive direction exceeds the sum of the voltage VC1 of the capacitor C1 and a twofold of the forward voltage drop Vf of the diode constituting the full bridge rectifier 120, namely VC1+2 Vf, the charge generated thereafter can be taken out as a direct current and stored in the capacitor C1. Further, during the period in which the displacement of the beam 104 keeps decreasing, the piezoelectric element 108 generates a current in the negative direction (i.e., the current Ipzt takes a negative value), and the electrical potential difference Vpzt between the first electrode 109a and the second electrode 109b increases in the negative direction in conjunction therewith. If the electrical potential difference Vpzt in the negative direction exceeds the sum of VC1 and 2Vf of the full bridge rectifier 120, the charge generated can be taken out as a direct current and stored in the capacitor C1. In other words, even when keeping the switch SW shown in FIG. 1B in the OFF state, the charge can be stored in the capacitor C1 regarding the part indicated by hatching in FIG. 2B.

Figure 2C:

In the power generation device 100 according to the present embodiment, the control circuit 112 sets the switch SW to the ON state with a period coinciding with the characteristic vibration period of the beam 104 and at arbitrary timings (with an arbitrary phase difference) unrelated to the state of the vibration of the beam 104. It should be noted that the amount of the charge (a power generation efficiency) which can be taken out from the piezoelectric element 108 in a predetermined period of time differs according to the timing at which the switch SW is set to the ON state, and the power generation efficiency is maximized in the case in which the switch SW is set to the ON state at the timing at which the deformation direction of the beam 104 is switched as shown in FIG. 2C. Hereinafter, the operation in the case in which the power generation efficiency is maximized will firstly be explained.

Figure 2D:
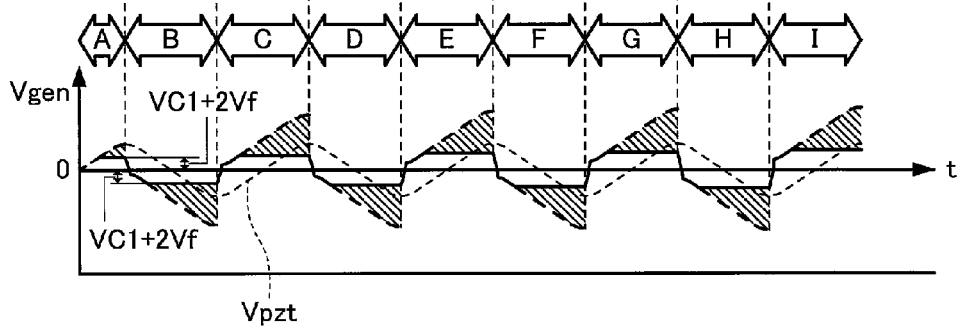

It is assumed that the control circuit 112 sets the switch SW to the ON state at the timing shown in FIG. 2C. Then, as shown in FIG. 2D, there occurs a phenomenon in which the voltage waveform between the terminals of the piezoelectric element 108 is changed as if it is shifted when the switch SW is set to the ON state. In other words, in the period B indicated as "B" in FIG. 2D, a voltage waveform indicated by the thick dotted line, which is looked as if the waveform of the voltage Vpzt indicated by the thin dotted line corresponding to the electromotive force of the piezoelectric element 108 is shifted toward the negative side, appears between the terminals of the piezoelectric element 108. The reason that such a phenomenon occurs will be described later. Further, in the period C indicated as "C" in FIG. 2D, there appears a voltage waveform indicated by the thick dotted line looked as if the voltage waveform Vpzt corresponding to the electromotive force of the piezoelectric element 108 is shifted toward the positive side. Similarly, thereafter, in each of the period D, the period E, the period F, and so on, there appears a voltage waveform indicated by the thick dotted line looked as if the voltage waveform Vpzt corresponding to the electromotive force of the piezoelectric element 108 is shifted toward the positive side or the negative side. Further, in the part (the part indicated by hatching in FIG. 2D) where the voltage waveform thus shifted exceeds the sum of VC1 and 2Vf, the charge generated in the piezoelectric element 108 can be stored in the capacitor C1. It should be noted that as a result of the flow of the charge from the piezoelectric element 108 to the capacitor C1, the voltage (the voltage between the first electrode 109a and the second electrode 109b) Vgen between the terminals of the piezoelectric element 108 is clipped at the voltage corresponding to the sum of VC1 and 2Vf. As a result, the waveform indicated by the thick solid line in FIG. 2D is obtained as the voltage waveform between the first electrode 109a and the second electrode 109b.

As is obvious from the comparison between the case of keeping the switch SW in the OFF state shown in FIG. 2B and the case of setting the switch SW to the ON state at the timing when the deformation direction of the beam 104 is switched as shown in FIG. 2D, in the power generation unit 100 according to the present embodiment, it becomes possible to efficiently store the charge in the capacitor C1 by setting the switch SW to the ON state at appropriate timings.

Further, if the charge is stored in the capacitor C1 to thereby increase the inter-terminal voltage of the capacitor C1, the shift amount of the voltage waveform also increases in accordance therewith. For example, in comparison between the period B (the state in which no charge is stored in the capacitor C1) in FIG. 2D and the period H (the state in which the charge is stored a little bit in the capacitor C1) in FIG. 2D, the shift amount of the voltage waveform is larger in the period H. Similarly, in comparison between the period C and the period I in FIG. 2D, the shift amount of the voltage waveform is larger in the period I in which the charge stored in the capacitor C1 is increased. Although the reason why such a phenomenon occurs will be described later, as a result, in the power generation unit 100 according to the present embodiment, it becomes also possible to store the voltage equal to or higher than the voltage Vpzt, which is generated between the first electrode 109a and the second electrode 109b by deforming the piezoelectric element 108, in the capacitor C1. As a result, it becomes unnecessary to provide an additional step-up circuit, and thus it becomes possible to obtain a small-sized and highly efficient power generation unit.

A-3. Operation Principle of Power Generation Unit

Figure 3A:
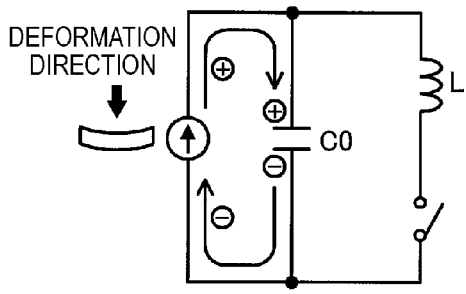
FIGS. 3A through 3F are explanatory diagrams conceptually showing an anterior half of the operation principle of the power generation unit according to the first embodiment.
Figure 3A:
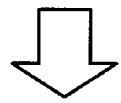
Figure 3B:
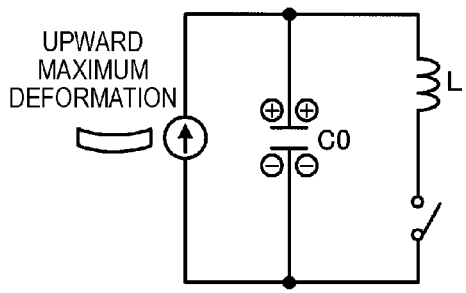
Figure 3B:
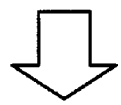

FIGS. 3A through 3F are explanatory diagrams conceptually showing an anterior half of the operation principle of the power generation unit 100 according to the present embodiment. Further, FIGS. 4A through 4F are explanatory diagrams conceptually showing a posterior half of the operation principle of the power generation unit 100 according to the present embodiment. FIGS. 3A through 3F conceptually show the movement of the charge in the capacitor C0 when setting the switch SW to the ON state in accordance with the deformation of the piezoelectric element 108. FIG. 3A shows the state in which the piezoelectric element 108 (the beam 104, to be precise) is deformed upward (so that the upper surface side has a concave shape). If the piezoelectric element 108 is deformed upward, the current in the positive direction flows from the current source, then the charge is stored in the capacitor C0, and the voltage in the positive direction is generated between the terminals of the piezoelectric element 108. The voltage value increases as the deformation of the piezoelectric element 108 increases. Then, the switch SW is set to the ON state at the timing (the timing at which the amount of the charge reaches a peak; see FIG. 3B) at which the deformation of the piezoelectric element 108 reaches a peak.

Figure 3C:
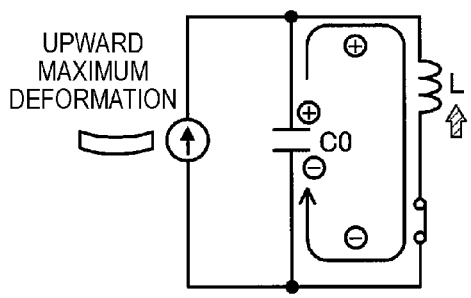
Figure 3C:
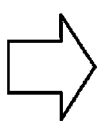

FIG. 3C shows the state immediately after setting the switch SW to the ON state. Since the charge is stored in the capacitor C0, the charge is urged to flow into the inductor L. Although a magnetic flux is generated (the magnetic flux increases) when a current flows through the inductor L, the inductor L has a nature (a self-induction effect) of generating a back electromotive force in the direction of preventing the change in the magnetic flux penetrating the inductor itself. Since the magnetic flux is urged to increase due to the charge flowing therethrough when the switch SW is set to the ON state, the back electromotive force occurs in the direction (in other words, the direction of hindering the flow of the charge) of preventing the magnetic flux from increasing. Further, the level of the back electromotive force is proportional to the variation rate (the variation per unit time) of the magnetic flux. In FIG. 3C, the back electromotive force generated in the inductor L in such a manner as described above is indicated by the arrow provided with hatching. Since such a back electromotive force occurs, only a little amount of the charge in the piezoelectric element 108 flows out when setting the switch SW to the ON state. In other words, the current flowing through the inductor L increases only gradually.

Figure 3F:
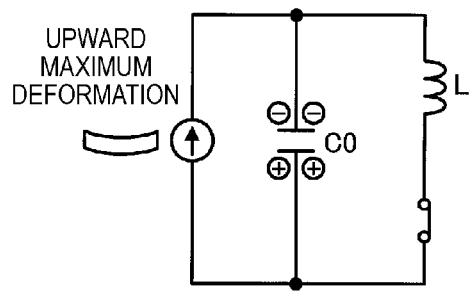
Figure 3F:
Figure 3E:
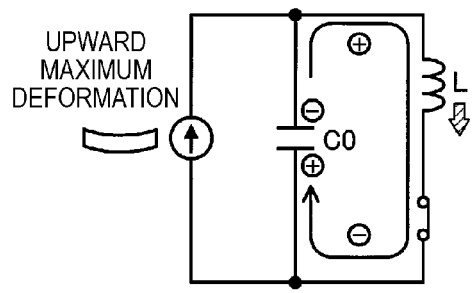
Figure 3E:
Figure 3D:
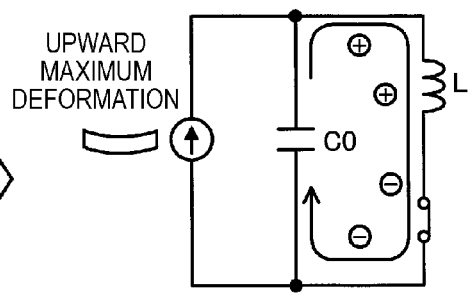

Subsequently, when the current flowing through the inductor L reaches a peak value, the variation rate of the magnetic flux reaches "0," and therefore, the back electromotive force reaches "0" as shown in FIG. 3D. Then, the current starts decreasing in turn. Then, since the magnetic flux penetrating the inductor L decreases, the electromotive force occurs in the inductor L in the direction (the direction of urging the current to flow) of preventing the decrease in the magnetic flux (see FIG. 3E). As a result, the current continues to flow through the inductor L while pulling out the charge from the capacitor C0 due to the electromotive force. Then, if no loss occurs during the migration of the charge, all the charge generated by the deformation of the piezoelectric element 108 is migrated, and there occurs the state (i.e., the state in which the positive charge is distributed on the lower surface side of the piezoelectric element 108, and the negative charge is distributed on the upper surface side) looked as if the positive and negative charges are replaced with each other. FIG. 3F shows the state in which all the charge generated by the deformation of the piezoelectric element 108 has been migrated.

If the switch SW is kept in the ON state without change, a converse phenomenon to the content described above occurs in turn. Specifically, the positive charge on the lower surface side of the piezoelectric element 108 is urged to flow into the inductor L, and at this moment, the back electromotive force in the direction of hindering the flow of the charge occurs in the inductor L. Subsequently, when the current flowing through the inductor L reaches the peak and then takes a downward turn, the electromotive force in the direction (the direction of urging the current to continue to flow) of preventing the current from decreasing occurs in turn in the inductor L. As a result, there occurs the state (the state shown in FIG. 3B) in which all the positive charge once located on the lower surface side of the piezoelectric element 108 has been migrated to the upper surface side. In such a manner as described above, the positive charge having returned to the upper surface side of the piezoelectric element 108 is migrated again to the lower surface side in the manner described above with reference to FIGS. 3B through 3F.

As described above, if the switch SW is set to the ON state in the state in which the charge is stored in the capacitor CO and is then kept in the ON state, there occurs a kind of resonant phenomenon in which the direction of the current is reversed alternately between the piezoelectric element 108 and the inductor L. Further, the period of the resonant phenomenon corresponds to the resonance period T of the so-called LC resonant circuit, and is therefore obtained by the formula $T=2\pi(LC)^{0.5}$, assuming that the value (capacitance) of the capacitive component CO included in the piezoelectric element 108 is C, the value (inductance) of the inductive component of the inductor L is L. Therefore, the time immediately after (the state shown in FIG. 3C) setting the switch SW to the ON state until the state shown in FIG. 3F occurs is obtained as T/2.

Figure 4A:
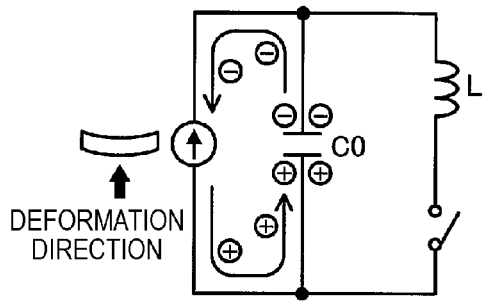
FIGS. 4A through 4F are explanatory diagrams conceptually showing a posterior half of the operation principle of the power generation unit according to the first embodiment.
Figure 4F:
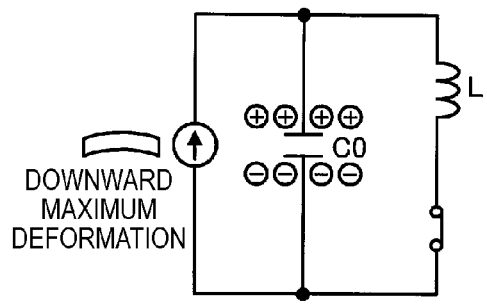
Figure 4F:
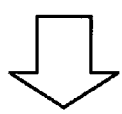
Figure 4F:
Figure 4B:
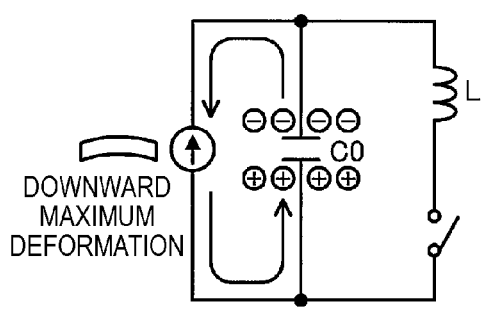
Figure 4E:
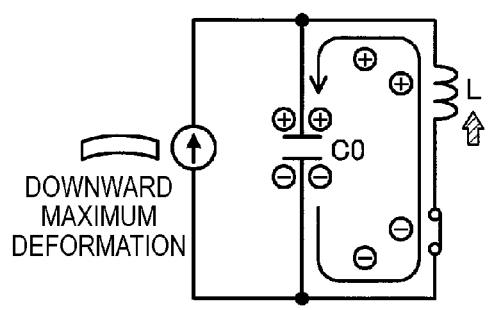
Figure 4E:
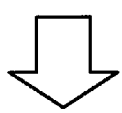
Figure 4E:
Figure 4C:
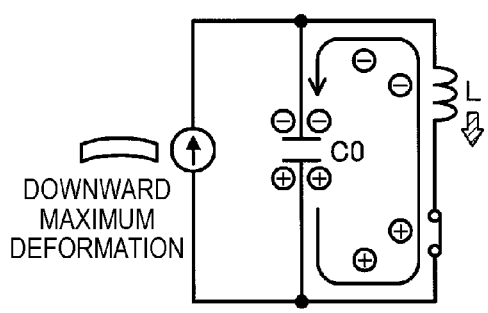
Figure 4D:
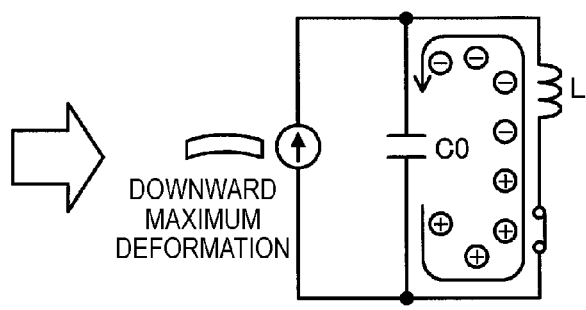

Therefore, the switch SW is set to the OFF state as shown in FIG. 4A at the time point when T/2 has elapsed after setting the switch SW to the ON state. Then, the piezoelectric element 108 (the beam 104, to be precise) is in turn deformed downward (so that the lower surface has a concave shape) in the present state. Although the piezoelectric element 108 is deformed upward in FIG. 3A described above, the piezoelectric element 108 is deformed downward in FIG. 4A, and therefore, the current flows from the current source in the negative direction, and the charge is stored in the capacitor CO so that the voltage between the terminals of the piezoelectric element 108 increases toward the negative side. Further, since the positive charge is distributed on the lower surface side of the piezoelectric element 108 and the negative charge is distributed on the upper surface side in the stage prior to deforming the piezoelectric element 108 (the beam 104, to be precise) downward as described above with reference to FIGS. 3A through 3F, it results that a new positive charge is stored on the lower surface side and a new negative charge is stored on the upper surface side in addition to these charges. FIG. 4B shows the state in which the new charges are stored in the piezoelectric element 108 by deforming the piezoelectric element 108 (the beam 104, to be precise) in the state of setting the switch SW to the OFF state.

Then, when setting the switch SW to the ON state in this state, the positive charge stored on the lower surface side of the piezoelectric element 108 is urged to flow into the inductor L. At this moment, since the back electromotive force occurs in the inductor L (see FIG. 4C), the current starts flowing gradually, and eventually reaches the peak, and then makes a downward turn. Then, the electromotive force occurs in the inductor L in the direction (the direction of urging the current to continue to flow) of preventing the current from decreasing (see FIG. 4E), and the current continues to flow due to the electromotive force. Eventually, there occurs the state in which all the positive charge once distributed on the lower surface side of the piezoelectric element 108 has been migrated to the upper surface side, and all the negative charge once distributed on the upper surface side thereof has been migrated to the lower surface side (see FIG. 4F). Further, the time necessary for migrating all the positive charge on the lower surface side to the upper surface side and migrating all the negative charge on the upper surface side to the lower surface side is equal to the time T/2 corresponding to a half cycle of the LC resonant circuit. Therefore, by setting the switch SW to the OFF state when the time T/2 has elapsed after setting the switch SW to the ON state, and then deforming in turn the piezoelectric element 108 (the beam 104, to be precise) upward (so that the upper surface side has a concave shape), the positive and negative charges can further be stored in the piezoelectric element 108.

As explained hereinabove, in the power generation unit 100 according to the present embodiment, by deforming the piezoelectric element 108 to thereby generate the charges, and then connecting the piezoelectric element 108 to the inductor L to thereby form the resonant circuit for a half cycle of the resonance period, the distributions of the positive and negative charges in the piezoelectric element 108 are reversed. Subsequently, the piezoelectric element 108 is in turn deformed in the opposite direction to thereby generate new charges. Since the distributions of the positive and negative charges in the piezoelectric element 108 have been reversed, it results that the charges newly generated are stored in the piezoelectric element 108. Subsequently, the piezoelectric element 108 is connected again to the inductor L for a half cycle of the resonance period to thereby reverse the distributions of the positive and negative charges in the piezoelectric element 108, and then the piezoelectric element 108 is deformed in the opposite direction. By repeating such operations, it is possible to increase the charge stored in the piezoelectric element 108 every time the piezoelectric element 108 is deformed in a repeated manner.

In the power generation unit 100 according to the present embodiment, the phenomenon of shifting the voltage waveform between the terminals of the piezoelectric element 108 occurs every time the switch SW is set to the ON state as described above with reference to FIGS. 2A through 2D, and this phenomenon occurs due to the following mechanism. Specifically, in the period A shown in FIG. 2D, for example, although the voltage is generated between the first electrode 109a and the second electrode 109b in accordance with the deformation of the piezoelectric element 108 (the beam 104, to be precise), since the first electrode 109a and the second electrode 109b are connected to the full bridge rectifier 120, the charge corresponding to the part exceeding the voltage of the sum of VC1 and 2Vf flows into the capacitor C1 connected to the full bridge rectifier 120. As a result, when setting the switch SW to the ON state at the time point when the deformation of the beam 104 reaches the peak, the positive and negative charges remaining in the piezoelectric element 108 at that moment are migrated via the inductor L, and the locations of the positive and negative charges in the piezoelectric element 108 are replaced with each other.

Then, when deforming the beam 104 in the opposite direction in the state in which the locations of the positive and negative charges are replaced with each other, the voltage waveform due to the piezoelectric effect appears between the first electrode 109a and the second electrode 109b of the piezoelectric element 108. In other words, it results that the voltage change due to the deformation of the piezoelectric element 108 occurs in the state in which the polarities of the first electrode 109a and the second electrode 109b of the piezoelectric element 108 are replaced with each other. As a result, there appears in the period B shown in FIG. 2D the voltage waveform looked as if the voltage waveform generated in the piezoelectric element 108 due to the deformation of the beam 104 is shifted. However, as described above, since the charge corresponding to the part exceeding the voltage of the sum of VC1 and 2Vf flows into the capacitor C1, the voltage between the first electrode 109a and the second electrode 109b of the piezoelectric element 108 is clipped at the voltage of the sum of VC1 and 2Vf. Subsequently, when setting the switch SW to the ON state for the time a half as long as the resonance period, the locations of the positive and negative charges remaining in the piezoelectric element 108 are replaced with each other. Then, by the deformation of the beam 104 starting from that state, the voltage waveform due to the piezoelectric effect appears in the piezoelectric element 108. Therefore, it results that there appears also in the period C shown in FIG. 2D the voltage waveform looked as if the voltage waveform due to the deformation of the beam 104 is shifted.

Further, as described above with reference to FIGS. 2A through 2D, in the power generation unit 100 according to the present embodiment, there also occurs the phenomenon that the shift amount of the voltage waveform gradually increases as the beam 104 repeats the deformation. Therefore, there can be obtained a significant advantage that the voltage higher than the electrical difference caused between the first electrode 109a and the second electrode 109b due to the piezoelectric effect of the piezoelectric element 108 can be stored in the capacitor C1. Such a phenomenon is caused by the following mechanism.

Firstly, as shown in the period A or the period B in FIG. 2D, in the case in which the capacitor C1 has not been charged, since the charge flows from the piezoelectric element 108 into the capacitor C1 when the voltage generated between the terminals of the piezoelectric element 108 exceeds 2Vf of the full bridge rectifier 120, the voltage appearing between the terminals of the piezoelectric element 108 is clipped at 2Vf. However, as the capacitor C1 is charged in such a manner as described above, the voltage between the terminals of the capacitor C1 increases. Then, thereafter, the charge does not flow into the capacitor C1 from the piezoelectric element 108 until the inter-terminal voltage of the capacitor C1 reaches a voltage higher than the sum of VC1 and 2Vf. Therefore, the value at which the voltage between the terminals of the piezoelectric element 108 is clipped gradually rises as the charge stored in the capacitor C1 increases.

In addition, as described above with reference to FIGS. 3A through 3F and 4A through 4F, on the condition that the charge is prevented from flowing out from the piezoelectric element 108, the charges in the piezoelectric element 108 continue to increase every time the piezoelectric element 108 (the beam 104, to be precise) is deformed, and the voltage between the terminals of the piezoelectric element 108 rises in conjunction therewith. Therefore, if the loss caused when the charge flows through the inductor L, the switch SW, and so on is not considered, it is possible to gradually increase the voltage between the terminals of the piezoelectric element 108. Therefore, according to the power generation unit 100 of the present embodiment, it becomes possible to generate the electrical power in the condition in which the voltage is automatically raised to the voltage necessary to drive the electrical load without providing an additional step-up circuit.

A-4. Switching Timing of Switch

As explained hereinabove, in the power generation unit 100 according to the present embodiment, by applying the cyclic deformation to the piezoelectric element 108 (the beam 104, to be precise), and connecting the piezoelectric element 108 to the inductor L for a period of time half as long as the resonance period at the timing when the deformation direction is switched, it is possible to obtain an excellent feature that the charge can efficiently be stored in the capacitor C1, and in addition, miniaturization can easily be achieved because no step-up circuit is required. However, since in the power generation unit 100 according to the present embodiment the timing at which the control circuit 112 sets the switch SW to the ON state is an arbitrary timing unrelated to the deformation state of the beam 104, the switch SW is not necessarily set to the ON state at the timing at which the deformation direction of the beam 104 is switched. However, even if the timing at which the switch SW is set to the ON state is an arbitrary timing, it is possible to step up the voltage Vgen between the terminals of the piezoelectric element 108 by setting the switch SW to the ON state for the period half as long as the resonance period of the LC resonant circuit with the period coinciding with the characteristic vibration period of the beam 104. Hereinafter, the reason therefor will be explained.

Figure 5A:
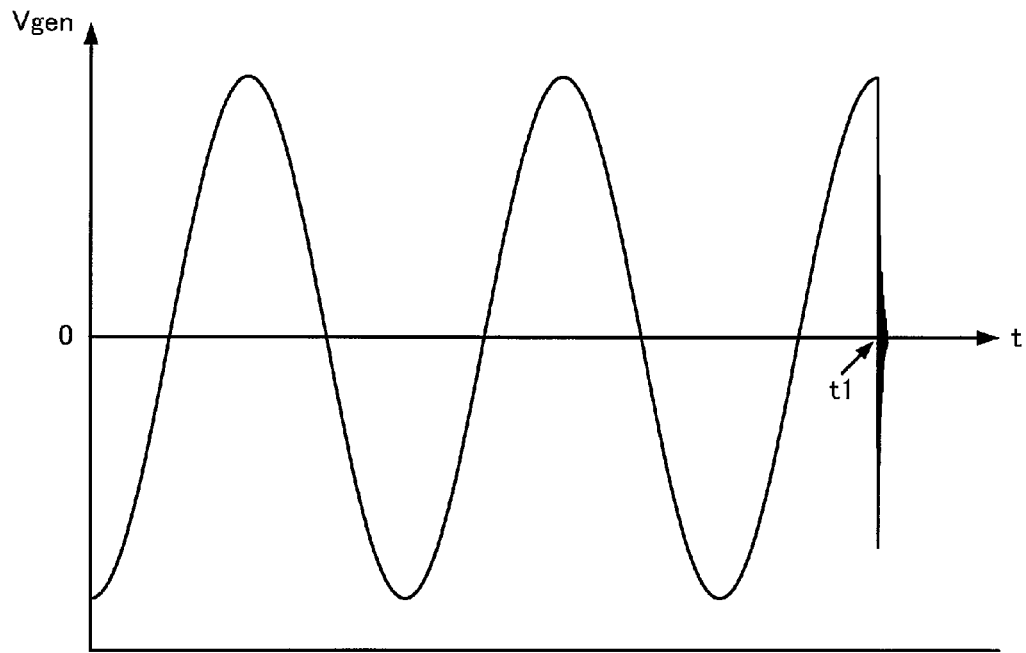
FIGS. 5A and 5B are explanatory diagrams showing the reason that it is possible to raise the voltage between terminals of a piezoelectric element even if a switch is set to the ON state at an arbitrary timing.
Figure 5B:
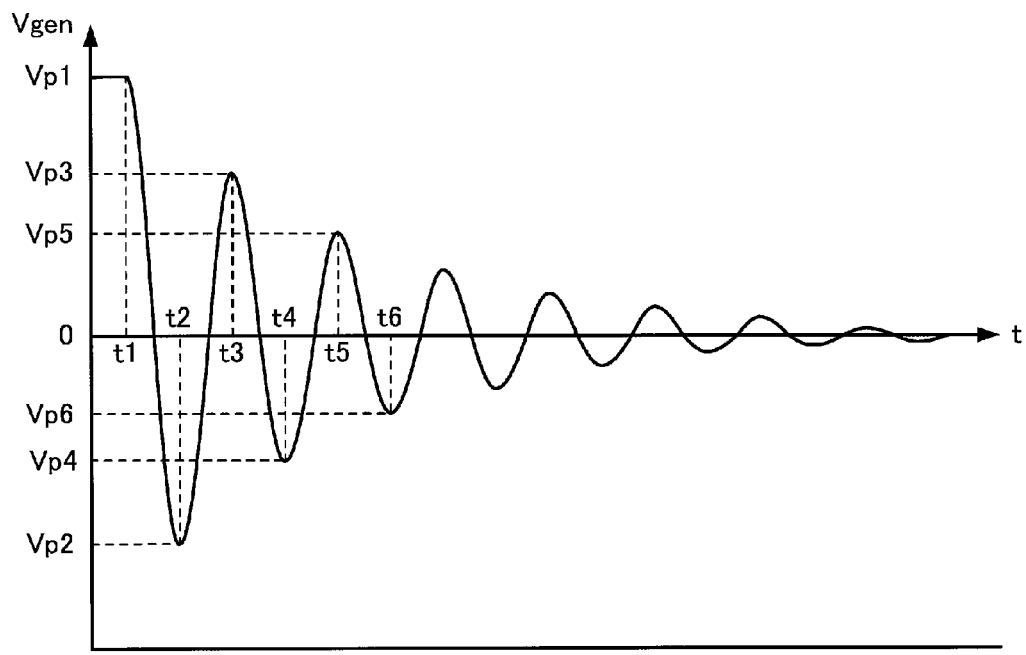

FIG. 5A shows the state of the voltage Vgen between the terminals of the piezoelectric element 108 in the case in which, for example, the switch SW is not set to the OFF state after setting it to the ON state at the time point t1 at which the deformation direction of the beam 104 is switched. FIG. 5B is a diagram obtained by enlarging a part of the waveform shown in FIG. 5A on and after the time point t1. It should be noted that it is assumed in the example shown in FIGS. 5A and 5B that the full bridge rectifier 120 and the capacitor C1 are eliminated.

At the time point t1, the voltage Vgen has a peak, and by setting the switch SW to the ON state, the voltage Vgen is attenuated while alternately showing positive and negative peak values Vp1, Vp2, Vp3, Vp4, Vp5, Vp6, . . . with a period (the time points t1, t2, t3, t4, t5, t6, . . .) half as long as the resonance period T of the LC resonant circuit. If the switch SW is set to the OFF state at the time point t2 when T/2 has elapsed from the time point t1, the shift amount of the voltage Vgen described above is obtained as the sum ($|Vp1|+|Vp2|$) of the absolute value of Vp1 and the absolute value of Vp2. It should be noted that, as explained with reference to FIGS. 3A through 3F, and 4A through 4F, since Vp2 is the voltage value when the positive and negative charges of the capacitive component C0 are replaced with each other due to the resonance of the LC resonant circuit, the larger the absolute value of Vp1 is, the larger the absolute value of Vp2 becomes. Therefore, the larger the absolute value of Vp1 is, the larger the shift amount of the voltage Vgen becomes.

Figure 6:
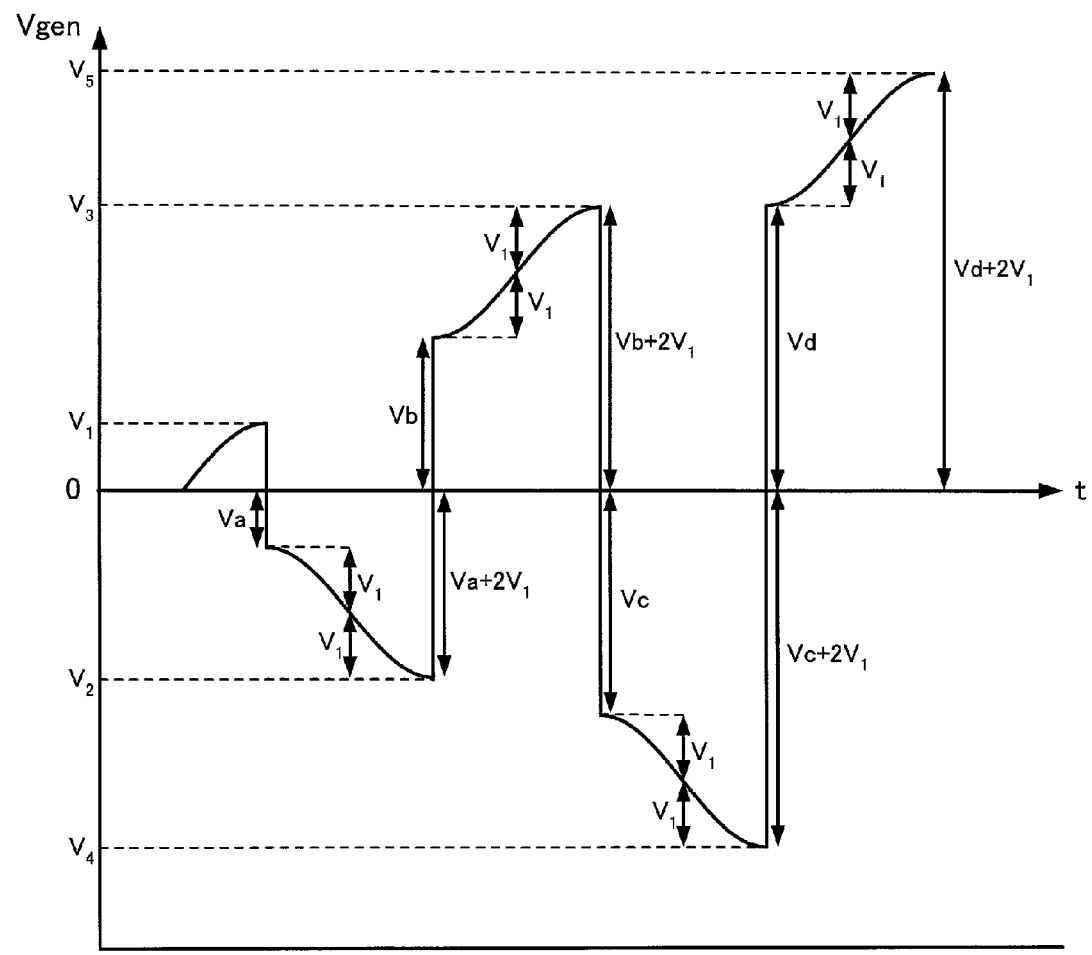
FIG. 6 are explanatory diagrams showing the reason that it is possible to raise the voltage between the terminals of the piezoelectric element even if the timing of setting the switch to the ON state is an arbitrary timing.

FIG. 6 shows the state of the voltage Vgen between the terminals of the piezoelectric element 108 in the case in which the switch SW is set to the ON state for the period as long as T/2 when the deformation direction of the beam 104 is switched. It should be noted that it is assumed in also the example shown in FIG. 6 that the full bridge rectifier 120 and the capacitor C1 are eliminated. Assuming that the amplitude of the electromotive force Vpzt generated by the piezoelectric element 108 is constant, if the switch SW is set to the ON state for the period of T/2 at the timing at which the voltage Vgen first reaches the positive peak value $V_1$, the voltage Vgen is shifted $V_1+Va$ toward the negative side as shown in FIG. 6. Then, the voltage value $V_2$ of Vgen when the second time the switch SW is set to the ON state is $V_2=-(Va+2V_1)$, and if the switch SW is set to the ON state for the period of T/2, the voltage Vgen is shifted $Vb+Va+2V_1$ toward the positive side. Similarly, the voltage value $V_3$ of Vgen when the third time the switch SW is set to the ON state is $V_3=Vb+2V_1$, and if the switch SW is set to the ON state for the period of T/2, the voltage Vgen is shifted $Vc+Vb+2V_1$ toward the negative side. Similarly, the voltage value $V_4$ of Vgen when the fourth time the switch SW is set to the ON state is $V_4=-(Vc+2V_1)$, and if the switch SW is set to the ON state for the period of T/2, the voltage Vgen is shifted Vd+Vc+2V$_1$ toward the positive side. Similarly, the voltage value V$_5$ of Vgen when the fifth time the switch SW is set to the ON state is V$_5$=Vd+2V$_1$. Here, since the voltage value V$_2$ is obtained as V$_2$=−(Va+2V$_1$), |V$_2$|>|V$_1$| is obviously true. Further, since the reference symbols V$_1$, V$_2$ denote the voltage values corresponding to the voltage value Vp1 shown in FIG. 5B, and the reference symbols Va, Vb denote the voltage values corresponding to the voltage value Vp2 shown in FIG. 5B, and |V$_2$|>|V$_1$| is true, Vb>Va is necessarily fulfilled. Therefore, since V$_2$ is obtained as V$_2$=−(Va+2V$_1$), V$_3$ is obtained as V$_3$=Vb+2V$_1$, and Vb>Va is true, |V$_3$|>|V$_2$| is true. Similarly, since |V$_3$|>|V$_2$| is true, Vc>Vb is necessarily fulfilled, and since V$_3$=Vb+2V$_1$, V$_4$=−(Vc+2V$_1$) are obtained, and Vc>Vb is true, |V$_4$|>|V$_3$| is true. Similarly, since |V$_4$|>|V$_3$| is true, Vd>Vc is necessarily fulfilled, and since V$_4$=−(Vc+2V$_1$), V$_5$=Vd+2V$_1$ are obtained, and Vd>Vc is true, |V$_5$|>|V$_4$| is true. In essence, by setting the switch SW to the ON state for the period of T/2 at the timing at which the deformation direction of the beam 104 is switched, the absolute value of the voltage Vgen between the terminals of the piezoelectric element 108 is stepped up in such a manner as |V$_1$|<|V$_2$|<|V$_3$|<|V$_4$|<|V$_5$|< . . .

Figure 7A:
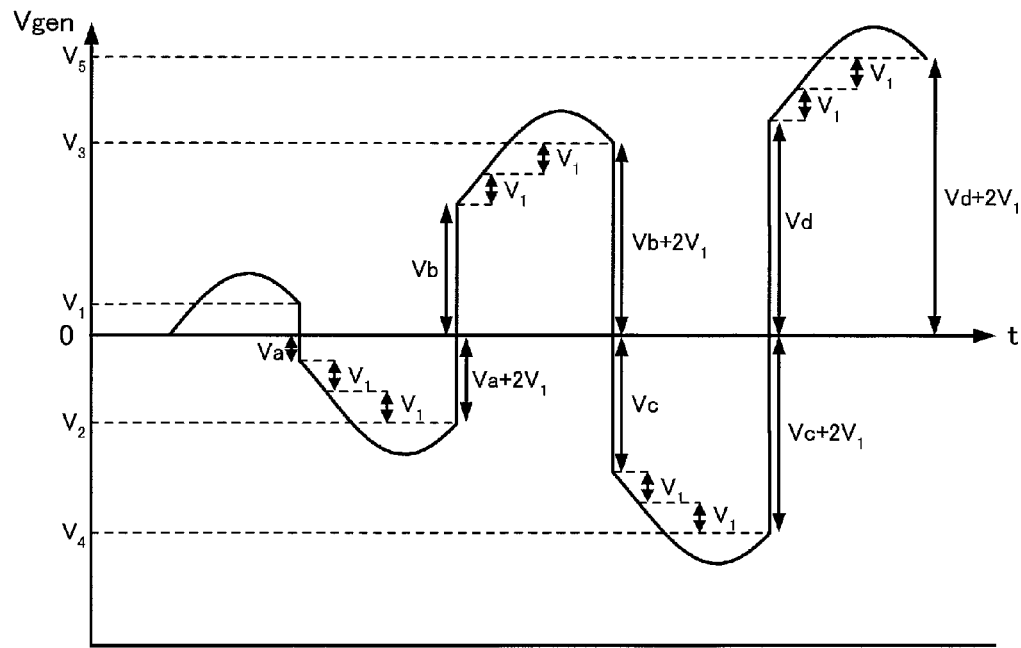
FIGS. 7A and 7B are explanatory diagrams showing the reason that it is possible to raise the voltage between the terminals of the piezoelectric element even if the switch is set to the ON state at an arbitrary timing.
Figure 7B:
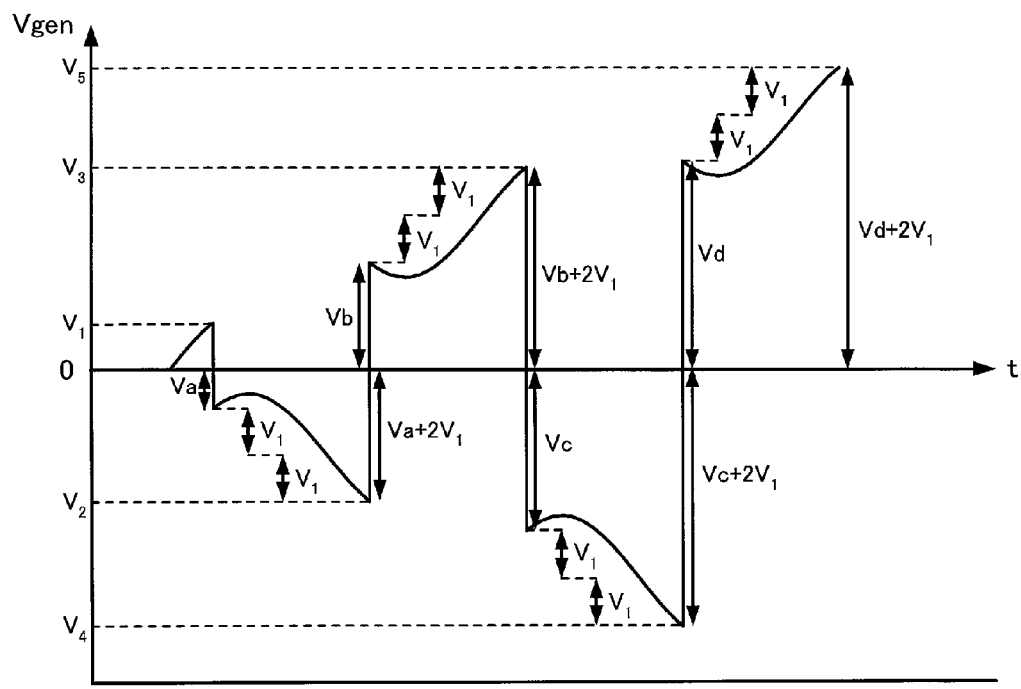

The same can be applied to the case in which the timing of switching the deformation direction of the beam 104 and the timing of setting the switch SW to the ON state are shifted from each other. FIG. 7A shows the state of the voltage Vgen in the case of setting the switch SW to the ON state for the period of T/2 after the timing at which the deformation direction of the beam 104 is switched, and FIG. 7B shows the state of the voltage Vgen in the case of setting the switch SW to the ON state for the period of T/2 before the timing at which the deformation direction of the beam 104 is switched. It should be noted that it is assumed in also the examples shown in FIGS. 7A and 7B that the full bridge rectifier 120 and the capacitor C1 are eliminated.

In the examples shown in FIGS. 7A and 7B, similarly to the example shown in FIG. 6, the voltage Vgen takes the voltage value V$_2$=−(Va+2V$_1$) when the second time the switch SW is set to the ON state with respect to the voltage value V$_1$ when the switch SW is first set to the ON state, the voltage value V$_3$=Vb+2V$_1$ when the third time the switch SW is set to the ON state, the voltage value V$_4$=−(Vc+2V$_1$) when the fourth time the switch SW is set to the ON state, the voltage value V$_5$=Vd+2V$_1$ when the fifth time the switch SW is set to the ON state, and so on. Here, since the voltage values V$_2$, V$_3$, V$_4$, V$_5$, . . . are expressed by the same formulas as those of the voltage values V$_2$, V$_3$, V$_4$, V$_5$, . . . in the case of FIG. 6, the conditions V$_2$>V$_1$, V$_3$>V$_2$, V$_4$>V$_3$, V$_5$>V$_4$, . . . are also fulfilled. Therefore, also in the case in which the switch SW is set to the ON state for the period of T/2 at the timing shifted before or after the timing at which the deformation direction of the beam 104 is switched, the voltage Vgen is stepped up in such a manner as |V$_1$|<|V$_2$|<|V$_3$|<|V$_4$|<|V$_5$|< . . . It should be noted that since the higher the voltage value V$_1$ is, the larger the voltage values Va, Vb, Vc, Vd, . . . become, the rate of stepping up the voltage Vgen is higher and the power generation efficiency is higher in the example shown in FIG. 6 than in the examples shown in FIGS. 7A and 7B.

It should be noted that in the case (the case of V$_1$=0 in FIGS. 7A and 7B) in which the switch SW is set to the ON state for the period of T/2 at the timing at which the displacement of the beam 104 vanishes (the voltage Vgen reaches 0), the resonance of the LC resonant circuit fails to occur, and the voltage Vgen does not rise.

As explained hereinabove, even if the timing at which the switch SW is set to the ON state is an arbitrary timing (it should be noted that the timing at which the displacement of the beam 104 vanishes (the voltage Vgen reaches 0) is excepted), it is possible to step up the voltage Vgen between the terminals of the piezoelectric element 108 by setting the switch SW to the ON state for the period half as long as the resonance period T of the LC resonant circuit.

Figure 8:
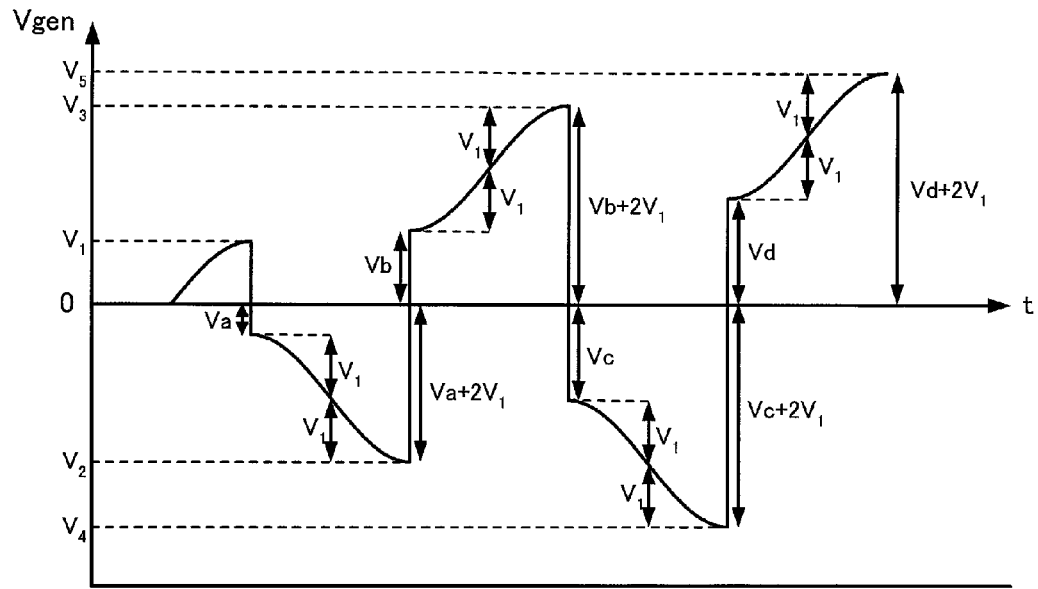
FIG. 8 is a diagram showing a voltage waveform between the terminals of the piezoelectric element in the case of setting the switch to the ON state for a period of time three halves as long as the resonance period of an LC resonant circuit.

It should be noted that although it is desirable to set the switch SW to the ON state for the period half as long as the resonance period T of the LC resonant circuit in order to improve the power generation efficiency, it is possible to step up the voltage Vgen also by setting the switch SW to the ON state for a predetermined period. For example, FIG. 8 shows the state of the voltage Vgen between the terminals of the piezoelectric element 108 in the case in which the switch SW is set to the ON state for the period three halves as long as the resonance period T at the timing at which the deformation direction of the beam 104 is switched. In essence, the case corresponds to the case in which the switch SW is set to the ON state at the time point t1 shown in FIG. 5B, and is then set to the OFF state at the time point t3. It should be noted that it is assumed in also the example shown in FIG. 8 that the full bridge rectifier 120 and the capacitor C1 are eliminated.

In the example shown in FIG. 8, similarly to the example shown in FIG. 6, the voltage Vgen takes the voltage value V$_2$=−(Va+2V$_1$) when the second time the switch SW is set to the ON state with respect to the voltage value V$_1$ when the switch SW is first set to the ON state, the voltage value V$_3$=Vb+2V$_1$ when the third time the switch SW is set to the ON state, the voltage value V$_4$=−(Vc+2V$_1$) when the fourth time the switch SW is set to the ON state, the voltage value V$_5$=Vd+2V$_1$ when the fifth time the switch SW is set to the ON state, and so on, and the voltage Vgen is stepped up in such a manner as |V$_1$|<|V$_2$|<|V$_3$|<|V$_4$|<V$_5$|< . . . It should be noted that since the higher the voltage value V$_1$ is, the larger the voltage values Va, Vb, Vc, Vd, . . . become, the rate of stepping up the voltage Vgen is higher and the power generation efficiency is higher in the example shown in FIG. 6 than in the example shown in FIG. 8.

Figure 9:
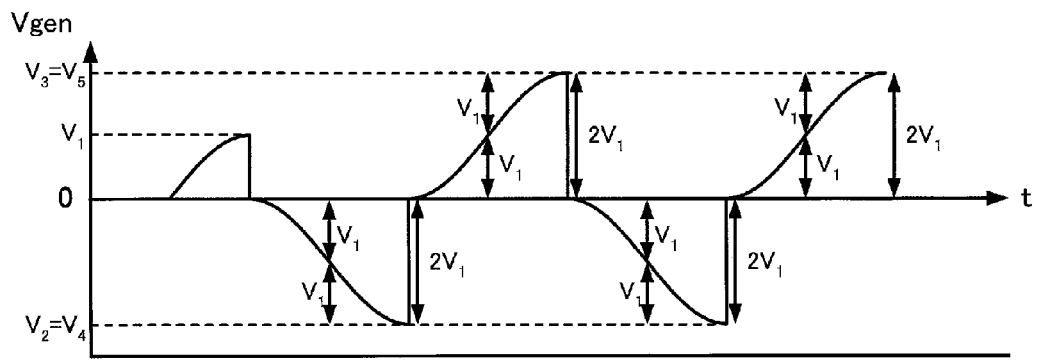
FIG. 9 is a diagram showing a voltage waveform between the terminals of the piezoelectric element in the case of setting the switch to the ON state for a period of time a quarter as long as the resonance period of the LC resonant circuit.

On the other hand, FIG. 9 shows the state of the voltage Vgen between the terminals of the piezoelectric element 108 in the case in which the switch SW is set to the ON state for the period a quater as long as the resonance period T at the timing at which the deformation direction of the beam 104 is switched. In essence, the case corresponds to the case in which the switch SW is set to the ON state at the time point t1 shown in FIG. 5B, and is then set to the OFF state at the time point (t1+t2)/2. It should be noted that it is assumed in also the example shown in FIG. 9 that the full bridge rectifier 120 and the capacitor C1 are eliminated.

In the example shown in FIG. 9, the voltage Vgen takes the voltage value V$_2$=−2V$_1$ when the second time the switch SW is set to the ON state with respect to the voltage value V$_1$ when the switch SW is first set to the ON state, the voltage value V$_3$=2V$_1$ when the third time the switch SW is set to the ON state, the voltage value V$_4$=−2V$_1$ when the fourth time the switch SW is set to the ON state, the voltage value V$_5$=2V$_1$ when the fifth time the switch SW is set to the ON state, and so on. In other wards, the voltage Vgen can be stepped up to 2V$_1$, but is not stepped up to a level exceeding 2V$_1$.

Similarly, also in the case of setting the switch SW to the ON state for the period obtained by multiplying either one of ¾, ⁵⁄₄, ⁷⁄₄, ⁹⁄₄, . . . by the resonance period T at the timing at which the deformation direction of the beam 104 is switched, the voltage values of V$_2$=−2V$_1$, V$_3$=2V$_1$, V$_4$=−2V$_1$, V$_5$=2V$_1$, . . . are obtained, and the voltage Vgen can be stepped up to 2V$_1$, but is not stepped up beyond 2V$_1$.

According to the process describe hereinabove, due to the resonance of the LC resonant circuit, by setting the switch SW to the OFF state at least when the polarity of the voltage Vgen is changed to the opposite polarity to the polarity thereof at the time point when the switch SW is set to the ON state, the voltage Vgen continues to rise. In essence, it is possible to efficiently step up the voltage Vgen by setting the predetermined period during which the switch SW is set to the ON state to the time at least longer than $(n+\frac{1}{4})T$ and shorter than $(n+\frac{3}{4})T$ (n denotes an arbitrary integer equal to or greater than 0) with respect to the resonance period T of the LC resonant circuit.

As described above, in the case of setting the switch SW to the ON state for the period half as long as the resonance period T of the LC resonant circuit, the shift amount when switching the switch SW takes the maximum value, and therefore, the highest power generation efficiency can be obtained. Therefore, in the power generation unit 100 according to the present embodiment, the control circuit 112 sets the switch SW to the ON state with the period coinciding with the characteristic vibration period of the beam 104, and sets the switch SW to the OFF state when the time half as long as the resonance period T has elapsed.

Figure 10:
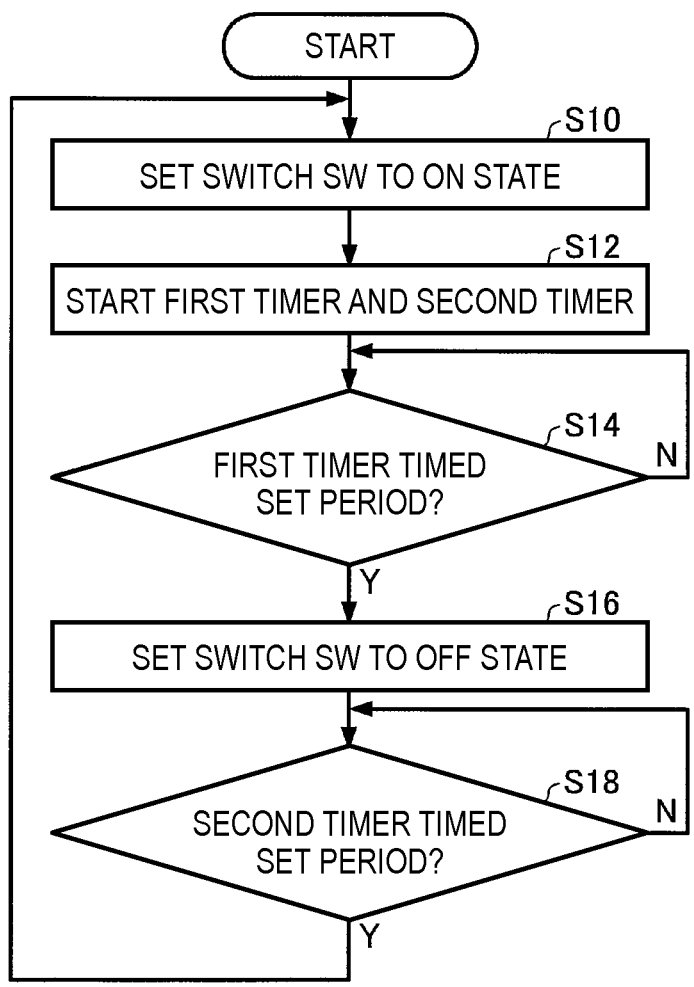
FIG. 10 is a flowchart of a switch control process in the first embodiment.

FIG. 10 is a flowchart showing a switch control process of switching between the ON and OFF states of the switch SW. This process is performed by, for example, a CPU incorporated in the control circuit 112.

When starting the switch control process, the CPU of the control circuit 112 sets (step S10) the switch SW to the ON state, and then starts (step S12) a first timer and a second timer not shown and incorporated in the control circuit 112. The first timer times a period set previously, specifically the period half as long as the resonance period of the LC resonant circuit in the present embodiment. It should be noted that the set period can also be rewritably stored in the memory 130, or the set period is not necessary required to be stored in the memory 130 if it can be constant. The second timer times a period set in the switching period information 132, specifically the period coinciding with the characteristic vibration period of the beam 104 in the present embodiment.

Then, the CPU of the control circuit 112 waits until the first timer times the set period (until the time half as long as the resonance period of the LC resonant circuit has elapsed) (N in the step S14), and then sets (step S16) the switch SW to the OFF state when the first timer times the set period (Y in the step S14).

Subsequently, the CPU of the control circuit 112 waits until the second timer times the set period (until the time coinciding with the characteristic vibration period of the beam 104 has elapsed) (N in the step S18), and then sets (step S10) the switch SW to the ON state again, and then repeats the series of processes described above when the second timer times the set period (Y in the step S18).

Since it is possible to at least step up the voltage between the terminals of the piezoelectric element 108 by performing the ON/OFF operation of the switch SW of the LC resonant circuit in such a manner as described above, it is possible to store the charges even if the voltage of the capacitor C1 rises.

It should be noted that the control circuit 112 in the present embodiment corresponds to a "control section" according to the invention.

As explained hereinabove, according to the power generation unit 100 of the first embodiment, since the LC resonant circuit can periodically be formed at the timing synchronous with the deformation state (the vibration state) of the beam 104 (the piezoelectric element 108) by setting the switch SW to the conductive state or the nonconductive state for a predetermined period based on the information of the characteristic vibration period of the beam 104, it becomes possible to store the charges in the piezoelectric element 108. Thus, the voltage between the terminals of the piezoelectric element 108 is raised to thereby improve the power generation efficiency. In particular, by setting the period during which the switch SW is kept in the ON state to a period half as long as the resonance period of the LC resonant circuit, the maximum power generation efficiency can be obtained.

B. Second Embodiment

In the power generation unit 100 according to the first embodiment, since the switch SW is set to the ON state at an arbitrary timing (with an arbitrary phase difference) independently of the state of the vibration of the beam 104, the power generation efficiency is varied dramatically due to the timing at which the switch SW is set to the ON state. Therefore, in the power generation unit 100 according to the second embodiment, the state of the vibration of the beam 104 is detected at a predetermined timing, and an adjustment is performed so that the switch SW is set to the ON state at the timing at which the deformation direction of the beam 104 is switched to thereby further improve the power generation efficiency. It should be noted that since some of the electrical power thus generated is consumed for detecting the state of the vibration of the beam 104, in particular in the power generation unit according to the second embodiment, in order to reduce the electrical power consumed for the vibration detection (detection of the vibration state) of the beam 104, the vibration detection of the beam 104 is performed only at a predetermined timing (e.g., in the initial operation, or when receiving an event signal from an external device), and is thereafter not performed a vibration detection during the operation of the power generation unit 100. Therefore, as the use condition of the power generation unit 100 according to the second embodiment, there are assumed, for example, the case (the case in which the environmental vibration always exists) in which the power generation unit is installed at the place where the beam 104 continues to vibrate after starting the operation, and the case (the case in which, for example, the power generation unit 100 is installed in a vehicle, and the event signal when starting the engine of the vehicle is input to the power generation unit 100) in which the event signal for starting the operation is input from an external device.

Figure 11:
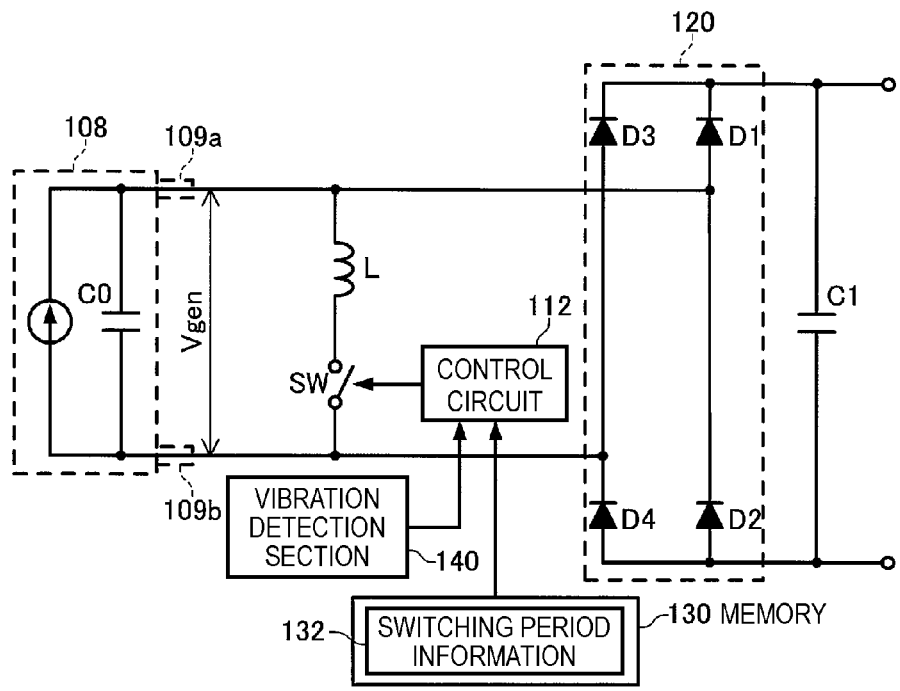
FIG. 11 is an explanatory diagram showing a structure of a power generation unit according to a second embodiment of the invention.

The mechanical structure of the power generation device 100 according to the second embodiment is substantially the same as that shown in FIG. 1A, and therefore the explanation therefor will be omitted. FIG. 11 shows the electrical structure of the power generation unit 100 according to the second embodiment. In FIG. 11, the constituents substantially the same as those in the first embodiment (shown in FIG. 1B) are denoted with the same reference symbols and the detailed explanation therefor will be omitted.

In the power generation unit 100 according to the second embodiment, a vibration detection section 140 is added to the power generation unit 100 according to the first embodiment. The vibration detection section 140 detects the vibration state of the beam 104 at a predetermined timing. Specifically, the vibration detection section 140 detects the vibration state of the beam 104 for a certain period of time at the predetermined timing to thereby specify the timing at which the deformation direction of the beam 104 is switched. Then, the control circuit 112 keeps the switch SW in the ON state for a predetermined period of time from the timing at which the deformation direction of the beam 104 is switched.

As shown in FIG. 2B, the timing at which the deformation direction of the beam 104 is switched coincides with the timing at which the electromotive force Vpzt generated in the piezoelectric element 108 reaches a peak, and the timing at which the current Ipzt due to the charge generated in the piezoelectric element 108 reaches 0. It should be noted that it is not achievable to directly monitor the electromotive force Vpzt and the current Ipzt generated in the piezoelectric element 108. On the other hand, since the voltage Vgen between the terminals of the piezoelectric element 108 is clipped at the voltage of the sum of VC1 and 2Vf as shown in FIG. 2D, it is also unachievable to detect the peak of the voltage Vgen.

Figure 12:
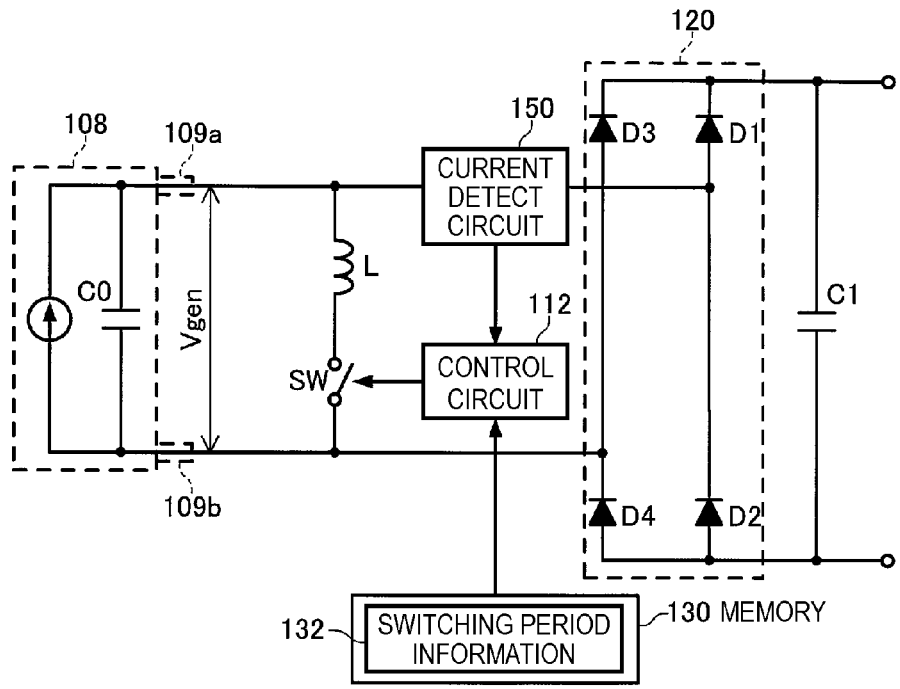
FIG. 12 is a diagram showing a circuit configuration example of the power generation unit according to the second embodiment.

Therefore, in the power generation unit 100 according to the second embodiment, the vibration detection section 140 is realized by a current detect circuit, and the timing at which the current flowing from the piezoelectric element 108 to the full bridge rectifier 120 vanishes is detected. FIG. 12 shows an example of a circuit diagram of the power generation unit 100 according to the second embodiment. The current detect circuit 150 is disposed between the first electrode 109a of the piezoelectric element 108 and the anode of the diode D1, and detects the current flowing from the piezoelectric element 108 to the full bridge rectifier 120. It should be noted that it is sufficient for the current detect circuit 150 to be able to detect the current flowing from the piezoelectric element 108 to the full bridge rectifier 120, and can also be disposed, for example, between the second electrode 109b of the piezoelectric element 108 and the anode of the diode D3.

Figure 13A:
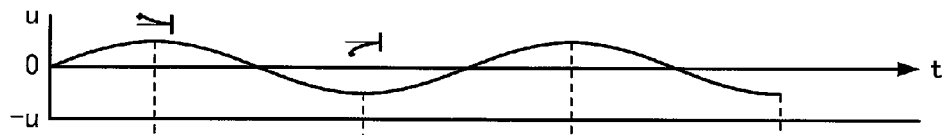
FIGS. 13A through 13F are explanatory diagrams showing the reason that the timing at which the deformation direction of a beam is switched can be determined by detecting a current flowing from a piezoelectric element to a full bridge rectifier.
Figure 13B:
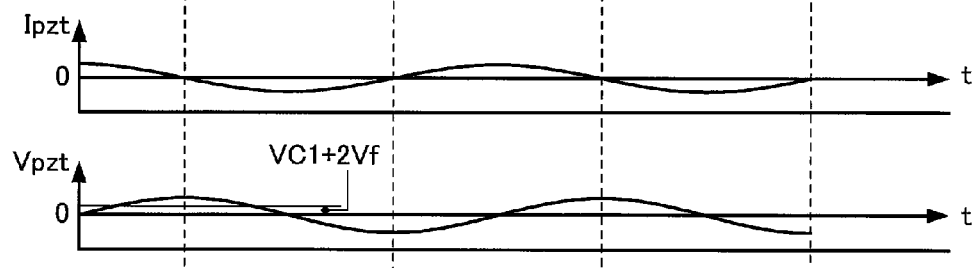

FIGS. 13A through 13F are explanatory diagrams showing the reason that the timing at which the deformation direction of the beam 104 is switched can be determined by detecting the current flowing from the piezoelectric element 108 to the full bridge rectifier 120. FIG. 13A shows the displacement of the beam 104. Further, FIG. 13B shows how the charge amount (i.e., the current Ipzt) generated by the piezoelectric element 108 per unit time, and the electromotive force Vpzt caused by the current Ipzt are varied due to the vibration of the beam 104.

As shown in the drawing, when the displacement of the beam 104 increases, the electromotive force Vpzt also increases. When the electromotive force Vpzt exceeds the sum of the voltage VC1 of the capacitor C1 and the twofold of the forward voltage drop Vf of the diode constituting the full bridge rectifier 120, namely VC1+2Vf, it results that the charge generated flows into the full bridge rectifier 120.

Further, at the timing (i.e., the timing at which the deformation direction of the beam 104 is switched) at which the magnitude of the displacement of the beam 104 reaches the peak, the direction of the current Ipzt generated by the piezoelectric element 108 is reversed. For example, when the magnitude of the displacement of the beam 104 reaches the peak in the state in which the piezoelectric element 108 generates the positive electromotive force, the current Ipzt having flown in the positive direction is reversed in the direction to flow in the negative direction. Therefore, the electromotive force of the piezoelectric element 108 decreases to thereby lower the voltage to a level lower than the sum of VC1 and 2Vf, and thus the current having flown to the full bridge rectifier 120 stops flowing. Similarly, since the current Ipzt in the positive direction occurs in the state in which the piezoelectric element 108 generates the negative electromotive force, the current having flown to the full bridge rectifier 120 stops flowing. Therefore, the timing (the timing at which the magnitude of the displacement of the beam 104 reaches the peak) at which the deformation direction of the beam 104 is switched coincides with the timing at which the current stops flowing from the piezoelectric element 108 to the full bridge rectifier 120. Therefore, as shown in FIG. 12, it is possible that the current flowing to the full bridge rectifier 120 is detected using the current detect circuit 150, and then the switch SW is set to the ON state for a predetermined period (e.g., the period half as long as the resonance period T of the LC resonant circuit) when the characteristic vibration period of the beam 104 has elapsed from the timing at which it is detected that the current stops flowing.

Figure 13C:
Figure 13D:
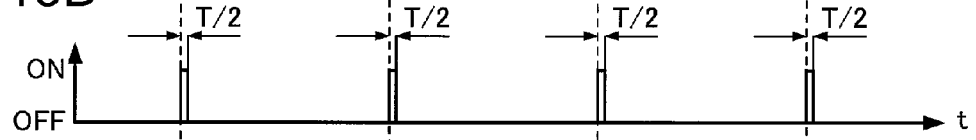

FIG. 13C shows the period in which the current detect circuit 150 is set to the ON state (the current detect circuit 150 is made to perform the current detection operation). Further, FIG. 13D shows the timings at which the switch SW is set to the ON or OFF state. The current detect circuit 150 is set to the ON state at, for example, a predetermined timing to detect the timing at which the current having flown to the full bridge rectifier 120 stops flowing, and is then set to the OFF state (terminates the current detection operation) if it is detected. The switch SW is set to the ON state for a predetermined period (T/2) from the timing detected by the current detect circuit 150, at which the current stops flowing to the full bridge rectifier 120, and is thereafter set to the ON state for a predetermined period (T/2) when the characteristic vibration period of the beam 104 has elapsed.

Figure 13E:
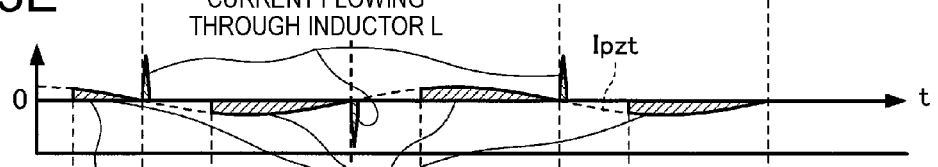
Figure 13F:
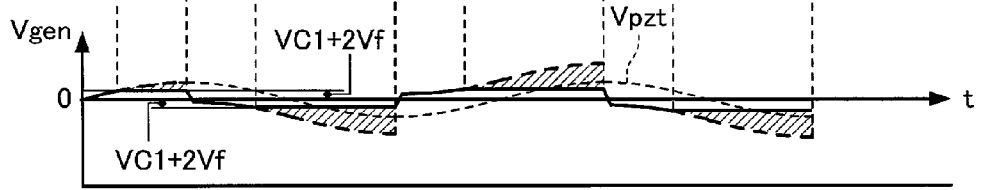

FIG. 13E shows the current flowing through the inductor L and the current flowing through the full bridge rectifier 120. As shown in FIG. 13E, every time the switch SW is set to the ON state, the charge in the piezoelectric element 108 flows through the inductor L, and the locations of the positive and negative charges in the piezoelectric element 108 are replaced with each other. Then, due to the deformation of the piezoelectric element 108 in the state in which the locations of the charges are replaced with each other, the voltage waveform shown in FIG. 13F is generated between the terminals of the piezoelectric element 108. Since the voltage waveform is the same as the voltage waveform described above using FIG. 2D, the explanation therefor will be omitted here. As a result, as shown in FIG. 13D, it becomes possible to efficiently store the current Ipzt generated in the piezoelectric element 108 in the capacitor C1.

FIG. 14 shows an example of a configuration block diagram of the current detect circuit 150. Further, FIGS. 15A through 15F show an example of output waveforms in some parts of the current detect circuit 150.

As a current detector 152, a device known to the public such as a Hall element current sensor or a shunt resistance can be used. However, since it is not desirable to insert a resistive element such as the shunt resistance in the circuit for preventing the power generation efficiency from being degraded, it is desirable to select a sensor capable of noncontact detection such as the Hall element current sensor.

An amplifier 154 amplifies an output signal (Id) of the current detector 152 at a predetermined gain.

An absolute-value circuit 156 outputs an absolute value signal of an output signal (Idamp) of the amplifier 154.

The amplifier 154 and the absolute-value circuit 156 are not essential circuits, but are added for making it easy for the comparator 158 to detect presence or absence of the current.

The comparator 158 binarizes the output signal (Iabs) of the absolute-value circuit 156 (converts the output signal into pulses), and then outputs the result. At the timing of the falling edge of the output signal (Ipls) of the comparator 158, the current flowing in the full bridge rectifier 120 vanishes. It should be noted that it is also possible to arrange that the state in which a little current flows is detected instead of the state in which no current flows at all. This configuration is adopted for preventing malfunction of the comparator 158 due to noises when no current flows. If a lot of margin is taken here, the power generation efficiency is degraded due to the shift of the detection timing, and therefore, it is preferable to reduce the noise as much as possible, and perform the detection at the timing at which the current approximates 0.

Figure 16:
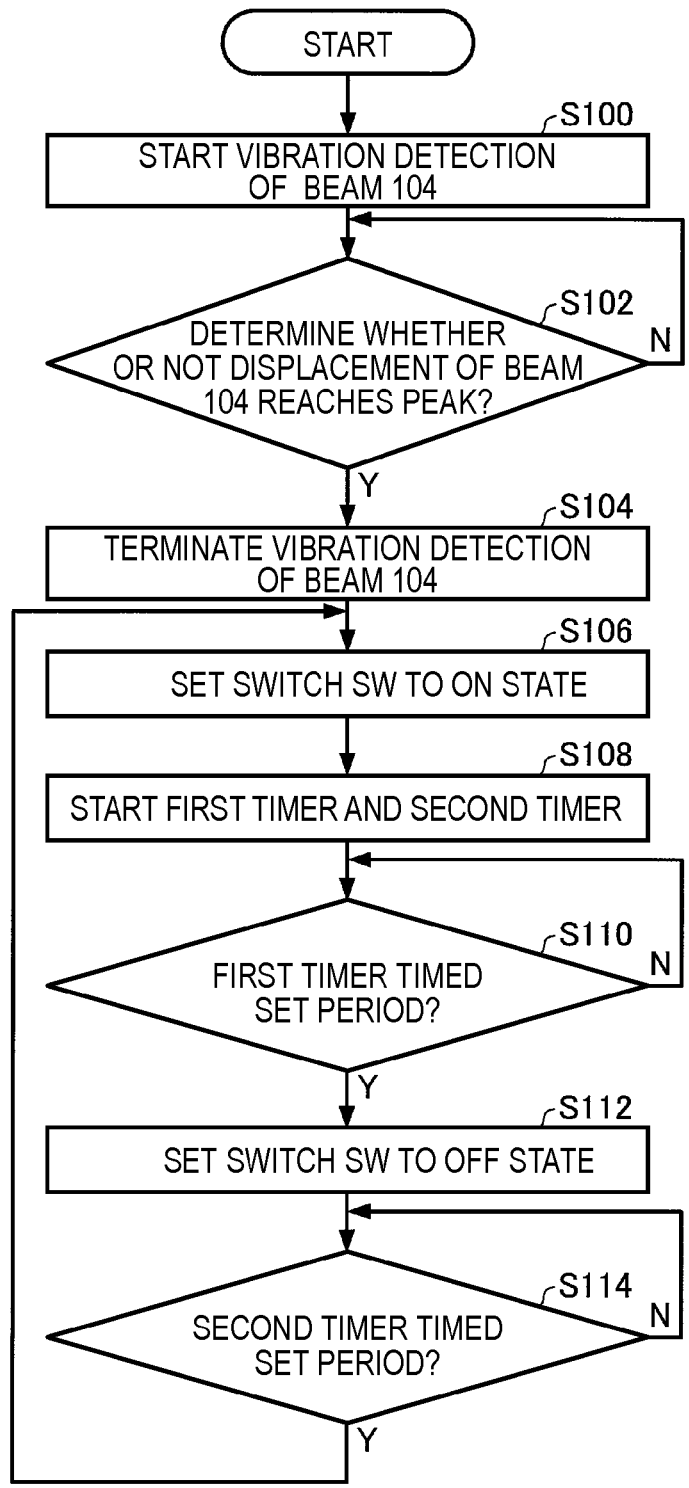
FIG. 16 is a flowchart of a switch control process according to the second embodiment.

FIG. 16 is a flowchart showing a switch control process of switching between the ON and OFF states of the switch SW in the power generation unit 100 according to the second embodiment. This process is performed by, for example, the CPU incorporated in the control circuit 112.

Firstly, in the initial operation of the power generation unit for starting the power generation operation after installing the power generation unit, the CPU of the control circuit 112 sets the vibration detection section 140 (the current detect circuit 150) to the ON state to thereby start (step S100) the vibration detection of the beam 104.

Subsequently, the CPU of the control circuit 112 monitors the output signal of the vibration detection section 140 (the current detect circuit 150), and determines (step S102) whether or not the displacement of the beam 104 reaches the peak. Specifically, the CPU of the control circuit 112 determines that the timing (the timing at which the deformation direction of the beam 104 is switched) at which the displacement of the beam 104 reaches the peak is reached at the timing at which the falling edge of the output signal (Ipls) of the current detect circuit 150 is detected. Further, when detecting the timing at which the displacement of the beam 104 reaches the peak, the CPU of the control circuit 112 sets the vibration detection section 140 (the current detect circuit 150) to the OFF state to thereby terminate (step S104) the vibration detection of the beam 104, and at the same time sets (step S106) the switch SW to the ON state.

The CPU of the control circuit 112 thereafter performs the same process as in the steps S10 through S18 shown in FIG. 10 in a repeated manner. In other words, after setting the switch SW to the ON state, the CPU of the control circuit 112 starts (step S108) the first timer and the second timer.

Then, the CPU of the control circuit 112 waits until the first timer times the set period (until the time half as long as the resonance period of the LC resonant circuit has elapsed) (N in the step S110), and then sets (step S112) the switch SW to the OFF state when the first timer times the set period (Y in the step S110).

Subsequently, the CPU of the control circuit 112 waits until the second timer times the set period (until the time coinciding with the characteristic vibration period of the beam 104 has elapsed) (N in the step S114), and then sets (step S106) the switch SW to the ON state again when the second timer has timed the set period (Y in the step S114), and then repeats the series of processes on and after the step S108 described above.

By performing the ON/OFF operation of the switch SW in the LC resonant circuit in such a manner as described above, it is possible to perform the adjustment so that the switch SW is set to the ON state at the most appropriate timing in the initial operation of the power generation unit 100, and to thereafter switch between the ON and OFF of the switch SW while holding the timing. Therefore, the power generation efficiency can be improved at least during the period in which the beam 104 continues the vibration.

It should be noted that in the flowchart shown in FIG. 16, the process (the vibration detection process of the beam 104) of the steps S100 through S104 is performed once in the initial operation of the power generation unit 100. However, it is also possible for the CPU of the control circuit 112 to, for example, wait until the event signal from an external device is received, and to perform the process of the steps S100 through S104 when receiving the event signal. In the case in which, for example, the power generation unit 100 is installed in a vehicle, and generation and stoppage of the environmental vibration are repeated in conjunction with turning ON/OFF of the engine of the vehicle, by the power generation unit 100 receiving the event signal when generation of the environmental vibration starts (e.g., when starting the engine), the high power generation efficiency can be maintained.

As explained hereinabove, according to the power generation unit 100 of the second embodiment, by detecting the vibration state of the beam 104 at a predetermined timing, and controlling the timing at which the switch SW is set to the ON state based on the detection result, it is possible to adjust the timing of forming the LC resonant circuit to the appropriate timing coinciding with the timing at which the deformation direction of the piezoelectric element 108 is switched. Further, after the adjustment, by setting the switch SW to the ON state only for a predetermined period of time with a predetermined period based on the information of the characteristic vibration period of the beam 104, it is possible to periodically form the LC resonant circuit while keeping the appropriate timing, and therefore, it becomes possible to efficiently store the charge in the piezoelectric element 108. Thus, the voltage between the terminals of the piezoelectric element 108 is efficiently raised to thereby improve the power generation efficiency.

C. Third Embodiment

Although in the power generation unit 100 according to the second embodiment, the current flowing through the full bridge rectifier 120 is detected to thereby determine the timing at which the deformation direction of the beam 104 is switched, since the current flowing through the full bridge rectifier 120 is so minute that the exact determination is difficult in some cases. Further, since the voltage Vgen between the terminals of the piezoelectric element 108 is clipped at the voltage of the sum of VC1 and 2Vf as described above, it is unachievable to detect the peak of the voltage Vgen. Therefore, in the power generation unit 100 according to the third embodiment, a second piezoelectric element is provided to the beam 104, and the peak of the voltage generated in the second piezoelectric element is detected to thereby perform the ON/OFF control of the switch SW.

Figure 17A:
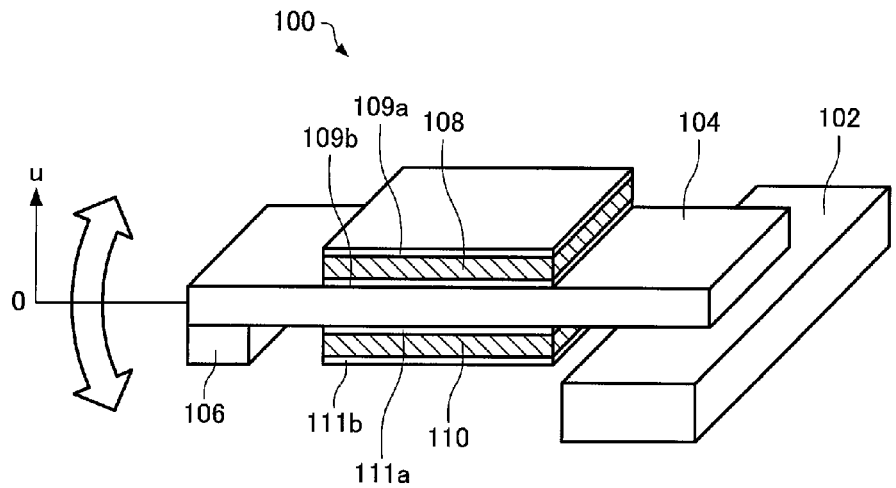
FIGS. 17A and 17B are explanatory diagrams showing a structure of a power generation unit according to a third embodiment of the invention.
Figure 17B:
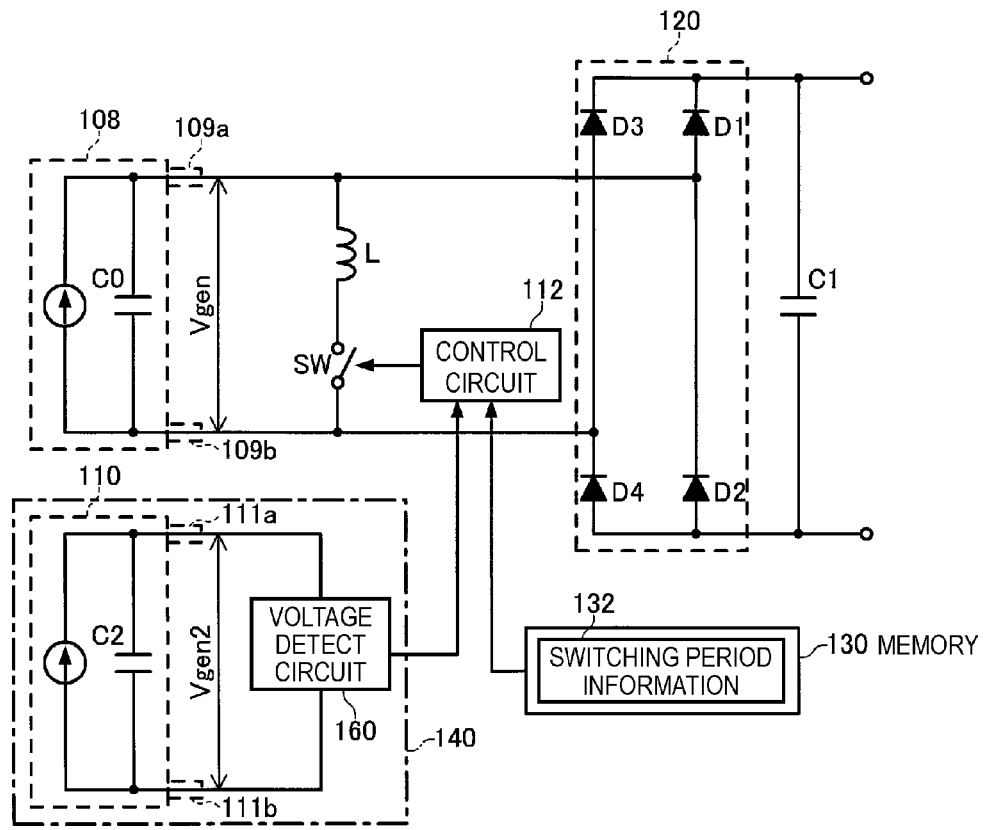

FIGS. 17A and 17B are explanatory diagrams showing a structure of the power generation unit 100 according to the third embodiment. FIG. 17A shows a mechanical structure of the power generation unit 100, and FIG. 17B shows an electrical structure thereof. In FIGS. 17A and 17B, the constituents substantially the same as those in the first embodiment (shown in FIGS. 1A and 1B) are denoted with the same reference symbols and the detailed explanation therefor will be omitted.

As shown in FIG. 17A, in the power generation unit 100 according to the third embodiment, the piezoelectric element 108 (a first piezoelectric element) is attached to the obverse surface of the beam 104, and at the same time a piezoelectric element 110 (a second piezoelectric element) is attached to the reverse surface of the beam 104. The first electrode (the upper electrode) 109a and the second electrode (the lower electrode) 109b are disposed on the surfaces of the piezoelectric element 108, and a first electrode (an upper electrode) 111a and a second electrode (a lower electrode) 111b are similarly disposed on the surfaces of the piezoelectric element 110. Although the piezoelectric element 108 and the piezoelectric element 110 have the same shape in the example shown in FIG. 17A, it is not necessary required for them to have the same shape. For example, if the piezoelectric element 108 has the maximum installable length and the maximum installable width with respect to the beam 104, a large power generation amount of the piezoelectric element 108 is obtained. On the other hand, if the piezoelectric element 110 has the minimum installable width (the length thereof in the direction along the shorter dimension of the beam 104), the displacement resistance of the beam 104 caused by the piezoelectric element 110 is reduced, and therefore, the power generation efficiency is improved.

When the beam 104 vibrates, a compressive force and a tensile force alternately act on the piezoelectric element 108 and the piezoelectric element 110 attached to the surfaces of the beam 104. Then, each of the piezoelectric elements 108, 110 generates positive and negative charges due to the piezoelectric effect, and the charges appear in the first electrodes 109a, 111a and the second electrodes 109b, 111b. In other words, when the beam 104 deforms, the piezoelectric element 110 is also deformed similarly to the piezoelectric element 108, and therefore, completely the same current Ipzt and electromotive force Vpzt as those of the piezoelectric element 108 are also generated in the piezoelectric element 110.

FIG. 17B shows an example of a circuit diagram of the power generation unit 100 according to the third embodiment. As shown in FIG. 17B, in also the power generation unit 100 according to the third embodiment, the inductor L and the switch SW are connected in series between the first electrode 109a and the second electrode 109b similarly to the first embodiment, and the ON/OFF control of the switch SW is performed by the control circuit 112. Further, the first electrode 109a and the second electrode 109b of the piezoelectric element 108 are connected to the full bridge rectifier 120, and the capacitor C1 is also connected to the full bridge rectifier 120.

On the other hand, the piezoelectric element 110 is provided for determining the timing for the control circuit 112 to set the switch SW to the ON state, and the first electrode 111a and the second electrode 111b provided to the piezoelectric element 110 are connected to a voltage detect circuit 160. It should be noted that the piezoelectric element 110 can also be electrically expressed as a current source and a capacitor C2 for storing a charge similarly to the piezoelectric element 108. The capacitance can be different between the capacitors C0, C2 due to the difference in size, thickness, and so on between the piezoelectric elements 108, 110.

Figure 18A:
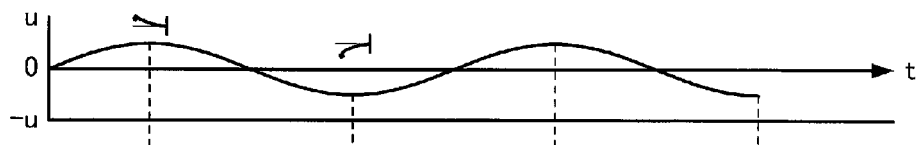
FIGS. 18A through 18F are explanatory diagrams showing the reason that the timing at which the deformation direction of a beam is switched can be determined by detecting a voltage generated by a second piezoelectric element.
Figure 18B:
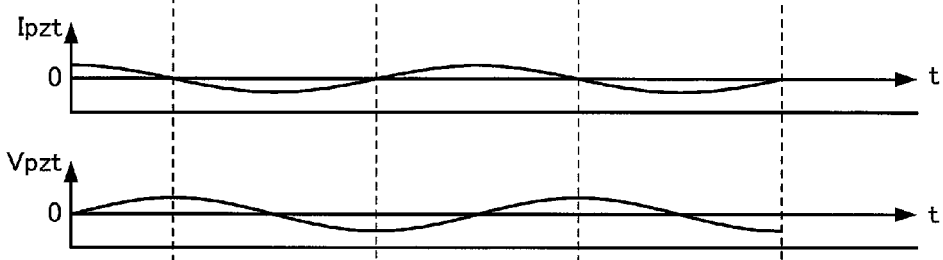

FIGS. 18A through 18F are explanatory diagrams showing the reason that the timing at which the deformation direction of the beam 104 is switched can be determined by detecting the voltage generated by the piezoelectric element 110. FIG. 18A shows the displacement of the beam 104. Further, FIG. 18B shows how the current Ipzt and the electromotive force Vpzt generated by the piezoelectric elements 108, 110 are varied due to the vibration of the beam 104.

Figure 18C:
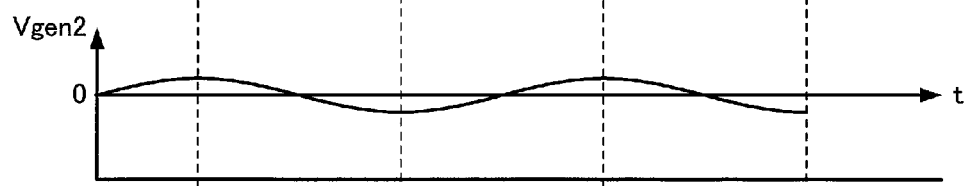

At the timing (i.e., the timing at which the deformation direction of the beam 104 is switched) at which the magnitude of the displacement of the beam 104 reaches the peak, the electromotive force Vpzt generated by the piezoelectric elements 108, 110 also reaches the peak. However, since the charges generated by the piezoelectric element 108 due to the deformation is pulled out by the inductor L or flows into the capacitor C1, the voltage Vgen between the terminals of the piezoelectric element 108 does not coincide with the electromotive force Vpzt. Therefore, the peak of the voltage Vgen fails to coincide with the timing at which the deformation direction of the beam 104 is switched. In contrast, since the piezoelectric element 110 is not connected to the inductor L and the capacitor C1, increase and decrease in the charge is directly reflected on the variation in the voltage (the voltage between the first electrode 111a and the second electrode 111b) Vgen2 between the terminals of the piezoelectric element 110. Therefore, as shown in FIG. 18C, the voltage Vgen2 between the terminals of the piezoelectric element 110 coincides with the electromotive force Vpzt. Therefore, the peak of the voltage Vgen2 coincides with the timing at which the deformation direction of the beam 104 is switched. Therefore, when detecting the peak of the voltage Vgen2 between the terminals of the piezoelectric element 110 using the voltage detect circuit 160 as shown in FIG. 17B, it is possible to set the switch SW to the ON state for a predetermined period (e.g., the period half as long as the resonance period T of the LC resonant circuit) when the predetermined period (the characteristic vibration period of the beam 104) set to the switching period information 132 has elapsed from that timing.

Figure 18D:
Figure 18E:
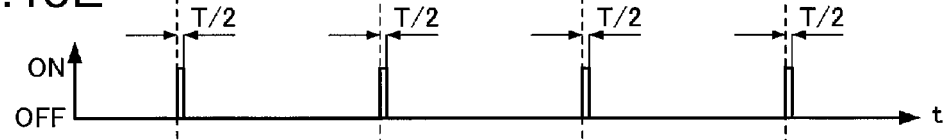

FIG. 18D shows the period in which the voltage detect circuit 160 is set to the ON state (the voltage detect circuit 160 is made to perform the voltage detection operation). Further, FIG. 18E shows the timings at which the switch SW is set to the ON or OFF state. The voltage detect circuit 160 is set to the ON state at, for example, a predetermined timing to detect the timing at which the voltage Vgen2 reaches the peak, and is then set to the OFF state (terminates the voltage detection operation) if it is detected. The switch SW is set to the ON state for a predetermined period (T/2) from the timing detected by the voltage detect circuit 160, at which the voltage Vgen2 reaches the peak, and is thereafter set to the ON state for a predetermined period (T/2) when the characteristic vibration period of the beam 104 has elapsed.

Figure 18F:
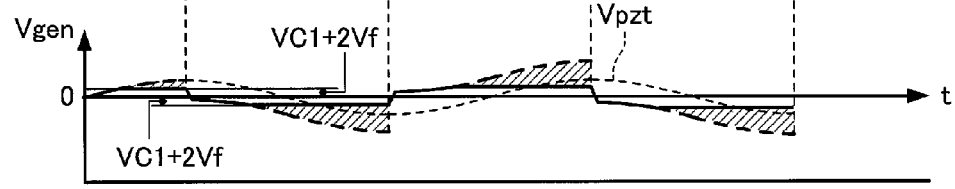

Further, due to the ON/OFF operation of the switch SW, the voltage waveform shown in FIG. 18F is generated between the terminals of the piezoelectric element 108. As a result, it becomes possible to efficiently store the current Ipzt generated in the piezoelectric element 108 in the capacitor C1.

Figure 19:
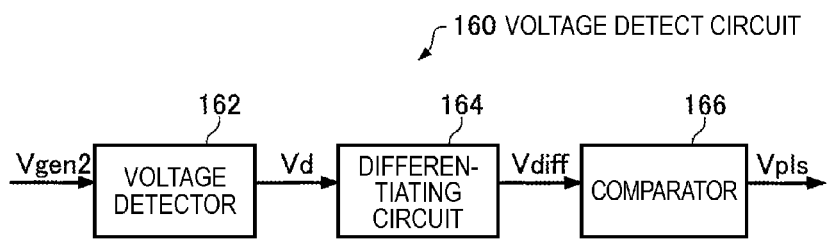
FIG. 19 is a diagram showing a configuration example of a voltage detect circuit.

FIG. 19 shows an example of a configuration block diagram of the voltage detect circuit 160. Further, FIGS. 20A through 20E show an example of output waveforms in some parts of the voltage detect circuit 160.

The voltage detector 162 detects the voltage Vgen2 between the terminals of the piezoelectric element 110.

A differentiating circuit 164 differentiates the output signal (Vd) of the voltage detector 162. The timing of the zero-cross of the output signal (Vdiff) of the differentiating circuit 164 coincides with the timing at which the voltage Vgen2 reaches the peak.

Figure 20A:
FIGS. 20A through 20E are diagrams showing output waveform examples of respective parts of the voltage detect circuit.
Figure 20B:
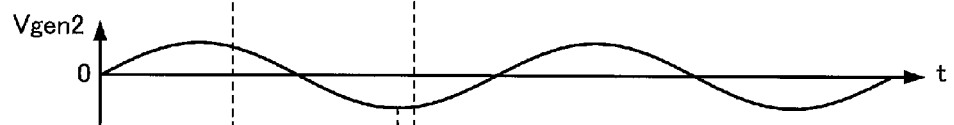
Figure 20C:
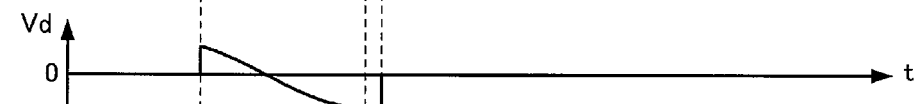
Figure 20D:
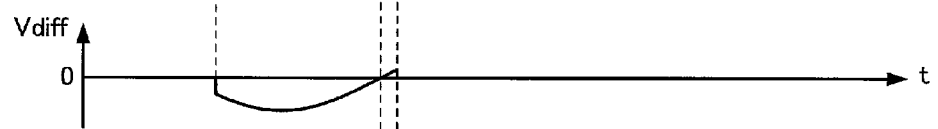
Figure 20E:

The comparator 166 binarizes the output signal (Vdiff) of the differentiating circuit 164 (converts the output signal into pulses), and then outputs the result. The voltage Vgen2 reaches the peak at the timing of the rising edge or the falling edge of the output signal (Vpls) of the comparator 166. In FIG. 20E, the voltage Vgen2 reaches the peak at the timing of the rising edge of the output signal (Vpls) of the comparator 166.

It should be noted that the flowchart of the switch control process of switching between the ON and OFF states of the switch SW in the power generation unit 100 according to the third embodiment is substantially the same as in the second embodiment (FIG. 16). It should be noted that in the power generation unit 100 according to the third embodiment, the CPU of the control circuit 112 sets the voltage detect circuit 160 to the ON state in the step S100 of FIG. 16, monitors the output signal of the voltage detect circuit 160 to thereby determine whether or not the displacement of the beam 104 reaches the peak in the step S102. Specifically, the CPU of the control circuit 112 determines that the timing (the timing at which the deformation direction of the beam 104 is switched) at which the displacement of the beam 104 reaches the peak is reached at the timing at which the rising edge or the falling edge of the output signal (Vpls) of the voltage detect circuit 160 is detected. Further, when detecting the timing at which the displacement of the beam 104 reaches the peak, the CPU of the control circuit 112 sets the voltage detect circuit 160 to the OFF state to thereby terminate (step S104) the vibration detection of the beam 104, and at the same time sets (step S106) the switch SW to the ON state.

It should be noted that the piezoelectric element 110, the first electrode 111a, the second electrode 111b, and the voltage detect circuit 160 correspond to the vibration detection section 140 in FIG. 11.

As explained hereinabove, according to the power generation unit 100 of the third embodiment, by detecting the voltage between the terminals of the piezoelectric element 110 at a predetermined timing, and controlling the timing at which the switch SW is set to the ON state based on the detection result, it is possible to adjust the timing of forming the LC resonant circuit to the appropriate timing coinciding with the timing at which the deformation direction of the piezoelectric element 108 is switched. Further, after the adjustment, by setting the switch SW to the ON state only for a predetermined period of time with a predetermined period based on the information of the characteristic vibration period of the beam 104, it is possible to periodically form the LC resonant circuit while keeping the appropriate timing, and therefore, it becomes possible to efficiently store the charge in the piezoelectric element 108. Thus, the voltage between the terminals of the piezoelectric element 108 is efficiently raised to thereby improve the power generation efficiency.

D. Fourth Embodiment

In the power generation unit 100 according to any one of the second embodiment and the third embodiment, the timing at which the switch SW is set to the ON state is determined in the initial operation, or using the event signal from an external device as a trigger, and thereafter, the switch SW is set to the ON state for the predetermined period of time (e.g., the period half as long as the resonance period T of the LC resonant circuit) with the predetermined period (the characteristic vibration period of the beam 104) set to the switching period information 132. However, if the predetermined period set to the switching period information 132 is slightly different from the characteristic vibration period of the beam 104, the timing at which the switch SW is set to the ON state and the timing at which the deformation direction of the beam 104 is switched gradually fail to coincide with each other after the power generation unit 100 starts the operation, and there is a possibility of degrading the power generation efficiency. Further, in the case in which the power generation unit 100 is installed in a place where the environmental vibration does not continue, when the vibration of the beam 104 restarts after the vibration has once stopped, the timing at which the switch SW is set to the ON state and the timing at which the deformation direction of the beam 104 is switched fail to coincide with each other, and in some cases, the power generation efficiency is degraded.

Therefore, in the power generation unit 100 according to the fourth embodiment, the vibration detection section 140 is set to the ON state with a predetermined period to thereby make the timing at which the switch SW is set to the ON state and the timing at which the deformation direction of the beam 104 is switched coincide with each other.

The power generation unit 100 according to the fourth embodiment is substantially the same as those of the second or third embodiment in mechanical structure and electrical structure, and is different therefrom only in the switch control process for switching between the ON/OFF states of the switch SW, and therefore, only the switch control process will hereinafter be explained.

Figure 21:
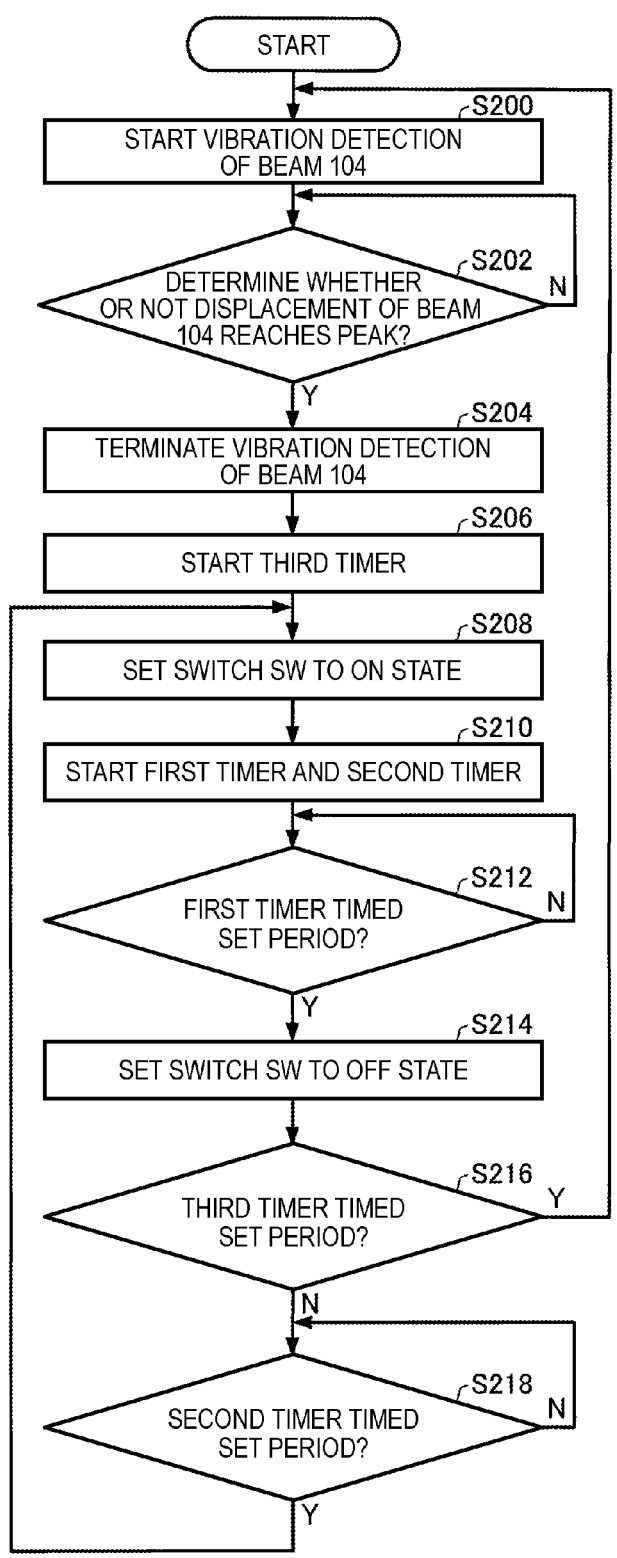
FIG. 21 is a flowchart of a switch control process according to a fourth embodiment of the invention.
Figure 22A:
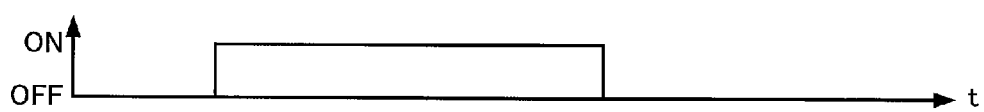
FIGS. 22A through 22F are diagrams showing output waveform examples of respective parts of a current detect circuit in a fifth embodiment of the invention.
Figure 22B:
Figure 22C:
Figure 22D:
Figure 22E:
Figure 22F:
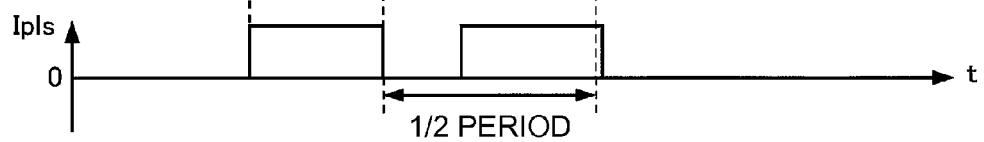
Figure 23A:
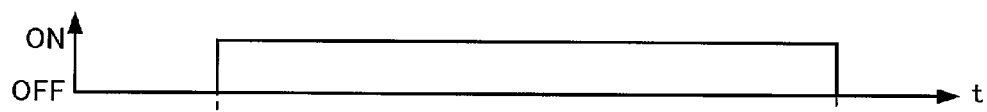
FIGS. 23A through 23E are diagrams showing output waveform examples of respective parts of a voltage detect circuit in the fifth embodiment.
Figure 23B:
Figure 23C:
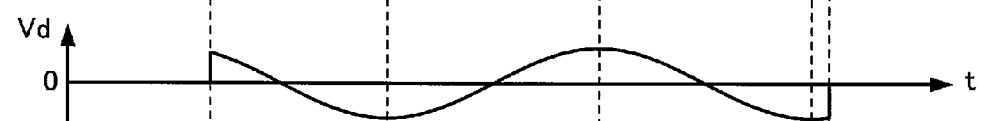
Figure 23D:
Figure 23E:
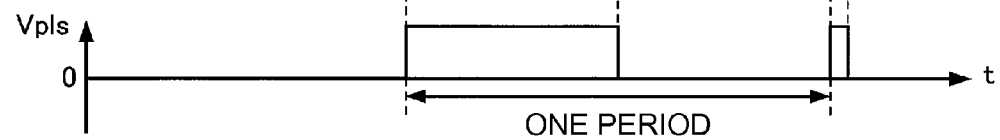

FIG. 21 is a flowchart showing a switch control process of switching between the ON and OFF states of the switch SW in the power generation unit 100 according to the fourth embodiment. This process is performed by, for example, the CPU incorporated in the control circuit 112.

Firstly, the CPU of the control circuit 112 sets the vibration detection section 140 to the ON state to thereby start (step S200) the vibration detection of the beam 104.

Subsequently, the CPU of the control circuit 112 monitors the output signal of the vibration detection section 140, and determines (step S202) whether or not the displacement of the beam 104 reaches the peak. Then, if the timing at which the displacement of the beam 104 reaches the peak is detected (Y in the step S202), the CPU of the control circuit 112 sets the vibration detection section 140 to the OFF state to thereby terminate (step S204) the vibration detection of the beam 104, and at the same time, starts (step S206) a third timer not shown and incorporated in the control circuit 112. The third timer times a period (e.g., several hours) set previously. The timing at which the switch SW is set to the ON state and the timing at which the deformation direction of the beam 104 is switched are shifted from each other with a certain period, and the set period is determined to be an appropriate period of time in accordance with the length of the period, frequency at which the environmental vibration stops, and so on. It should be noted that the set period can also be rewritably stored in the memory 130, or the set period is not necessary required to be stored in the memory 130 if it can be constant.

Subsequently, the CPU of the control circuit 112 sets (step S208) the switch SW to the ON state, and then starts (step S210) the first timer and the second timer.

Then, the CPU of the control circuit 112 waits until the first timer times the set period (until the time half as long as the resonance period of the LC resonant circuit has elapsed) (N in the step S212), and then sets (step S214) the switch SW to the OFF state when the first timer times the set period (Y in the step S212).

Subsequently, the CPU of the control circuit 112 determines (step S216) whether or not the third timer has timed the set period. If the third timer has not timed the set time (N in the step S216), the CPU waits until the second timer times the set period (until the time coinciding with the characteristic vibration period of the beam 104 has elapsed) (N in the step S218), and then sets (step S208) the switch SW to the ON state again when the second timer has timed the set period (Y in the step S218), and then repeats the series of processes on and after the step S210 described above.

In contrast, if the third timer has timed the set period (Y in the step S216), the CPU of the control circuit 112 sets the vibration detection section 140 to the ON state again to thereby start (step S200) the vibration detection of the beam 104, and then repeats the series of processes on and after the step S202 described above.

Since the switch SW can be adjusted so as to be set to the ON state periodically and at the appropriate timing by performing the ON/OFF control of the switch SW of the LC resonant circuit in such a manner as described above, the power generation efficiency can be kept at a higher level.

E. Fifth Embodiment

Although it is assumed in the power generation unit 100 according to any one of the second, third, and fourth embodiments that the characteristic vibration period is constant, in reality, if the power generation unit 100 has been used for a long period of time, it is possible that the vibration period is slightly varied due to the minute variation in weight of the beam 104 caused by the rust attached thereto or the time degradation of the fixation part (the root of the beam 104) between the beam 104 and the base 102. If the predetermined period set to the switching period information 132 fails to coincide with the vibration period of the beam 104 due to the reason described above, the timing at which the switch SW is set to the ON state and the timing at which the deformation direction of the beam 104 is switched gradually fail to coincide with each other, and it is possible that the power generation efficiency is degraded.

Therefore, in the power generation unit 100 according to the fifth embodiment, the vibration period of the beam 104 is measured with a predetermined period, and then the switching period of the switch SW is updated in accordance with the measurement result.

The power generation unit 100 according to the fifth embodiment is substantially the same as those of one of the second, third, and fourth embodiments in mechanical structure and electrical structure, and is different therefrom only in the updating process of the switching period of the switch SW by the control circuit 112, and therefore, only the updating process of the switching period of the switch SW will hereinafter be explained.

In the power generation unit 100 according to the fifth embodiment, the control circuit 112 sets the vibration detection section 140 to the ON state for a predetermined period of time with a predetermined period, and measures the vibration period of the beam 104 based on the output signal of the vibration detection section 140. Then the control circuit 112 updates the switching period information 132 with the vibration period thus measured.

FIGS. 22A through 22F show an example of output waveforms in some parts of the current detect circuit 150 in the updating process of the switching period of the switch SW in the case of realizing the vibration detection section 140 as the current detect circuit 150. The control circuit 112 makes the current detect circuit 150 continue the detection operation until, for example, the falling edge of the output signal (Ipls) of the current detect circuit 150 occurs at least two times, and then measures the time between the falling edges of the output signal (Ipls) of the current detect circuit 150. The time between the falling edges is equal to the period half as long as the vibration period of the beam 104. It should be noted that in order to improve the measurement accuracy of the vibration period of the beam 104, it is possible to increase the detection operation time of the current detect circuit 150 and to, for example, average the periods between the falling edges of the output signal (Ipls) of the current detect circuit 150.

Further, FIGS. 23A through 23E show an example of output waveforms in some parts of the voltage detect circuit 160 in the updating process of the switching period of the switch SW in the case of realizing the vibration detection section 140 using the piezoelectric element 110 (the second piezoelectric element) and the voltage detect circuit 160. The control circuit 112 makes the voltage detect circuit 160 continue the detection operation until, for example, the rising edge or the falling edge of the output signal (Vpls) of the voltage detect circuit 160 occurs at least two times, and then measures the time between the rising edges or the falling edges of the output signal (Vpls) of the voltage detect circuit 160. The time between the rising edges or the falling edges is equal to the vibration period of the beam 104. It should be noted that in order to improve the measurement accuracy of the vibration period of the beam 104, it is possible to increase the detection operation time of the voltage detect circuit 160 and to, for example, average the periods between the rising edges or the falling edges of the output signal (Vpls) of the voltage detect circuit 160.

Figure 24:
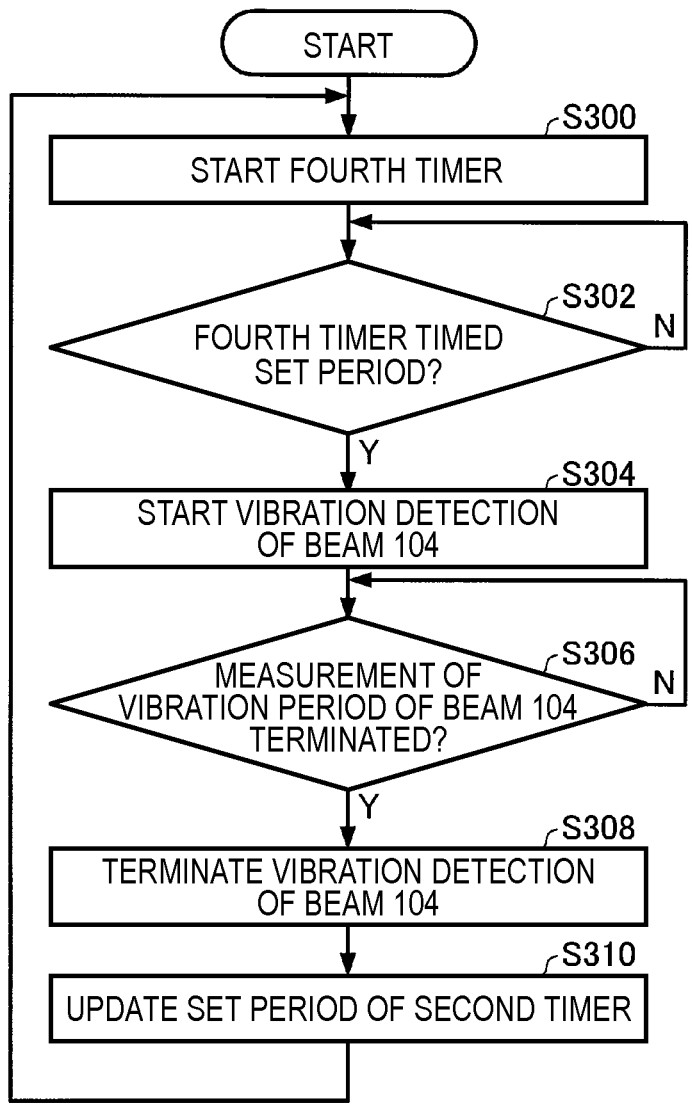
FIG. 24 is a flowchart of an update process of a switching period of a switch in the fifth embodiment.

FIG. 24 is a flowchart showing an updating process of the switching period of the switch SW in the power generation unit 100 according to the fifth embodiment. This process is performed by, for example, the CPU incorporated in the control circuit 112.

Firstly, the CPU of the control circuit 112 starts (step S300) a fourth timer, and then waits until the fourth timer has timed a set period (N in the step S302). The fourth timer times a period (e.g., several months) set previously. The set period is determined to be an appropriate period in accordance with, for example, the period necessary for the weight and so on of the beam 104 to vary an amount equal to or larger than a predetermined amount due to the time degradation. It should be noted that the set period can also be rewritably stored in the memory 130, or the set period is not necessary required to be stored in the memory 130 if it can be constant.

If the fourth timer has timed the set period (Y in the step S302), the CPU of the control circuit 112 sets the vibration detection section 140 to the ON state to thereby start (step S304) the vibration detection of the beam 104. Then, the CPU of the control circuit 112 monitors the output signal of the vibration detection section 140 to thereby measure the vibration period of the beam 104, and when terminating the measurement of the vibration period of the beam 104 (Y in the step S306), the CPU sets the vibration detection section 140 to the OFF state to thereby terminate (step S308) the vibration detection of the beam 104.

Then, the CPU of the control circuit 112 updates (step S310) the set period (the period with which the switch SW is set to the ON state) of the second timer with the vibration period of the beam 104 thus measured, and then repeats the series of processes described above.

It should be noted that it is also possible to simultaneously perform a process of conforming the timing at which the switch SW is set to the ON state to the timing at which the deformation direction of the beam 104 is switched in the updating process of the switching period of the switch SW.

By periodically updating the switching period of the switch SW in such a manner as described above, it is possible to correct the difference between the timing at which the switch SW is set to the ON state and the timing at which the deformation direction of the beam 104 is switched to thereby keep the high power generation efficiency.

F. Modified Examples

F-1. First Modified Example

In the second embodiment described above, the explanation is presented assuming that the current detection sensor such as Hall element is disposed in the current detect circuit 150, and the timing at which the current stops is detected by processing the output thereof. However, it is also possible to change some of the diodes D1 through D4 constituting the full bridge rectifier 120 to a photo coupler, and to directly detect presence or absence of the current using the photo coupler.

For example, it is also possible to change the diodes D2 and D4 to the photo coupler, or to change the diodes D1 and D3 to the photo coupler. Alternatively, it is also possible to change the diodes D1 and D4 to the photo coupler, or to change the diodes D2 and D3 to the photo coupler. By adopting such a configuration, during the period in which the current is flowing through the full bridge rectifier 120, the fact can be detected by either of the photo couplers. Therefore, it is possible for the current detect circuit 150 to promptly detect the fact that current flowing through the full bridge rectifier 120 stops. As a result, as described above, it becomes possible to set the switch SW to the ON state at an appropriate timing without installing the current detection sensor such as a Hall element, or performing a complicated process of, for example, amplifying the output of the sensor to obtain the absolute value, and comparing the absolute value thus obtained with a threshold value.

Alternatively, it is also possible to arrange that the photo coupler is inserted between the first electrode 109a and the second electrode 109b of the piezoelectric element 108 and the full bridge rectifier 120 to thereby detect presence and absence of the current flowing through the full bridge rectifier 120.

F-2. Second Modified Example

Further, although the explanation is presented in the second through fifth embodiments described above citing the configuration, which uses the current detect circuit 150, or the combination of the piezoelectric element 110 and the voltage detect circuit 160 as the vibration detection section 140, as an example, it is also possible for the vibration detection section 140 to have another configuration. It is also possible to directly detect the vibration (the displacement) of the beam 104 using a proximity sensor of a noncontact type such as an optical type, an ultrasonic type, an eddy-current type, or a capacitance type, or using a contact sensor.

F-3. Third Modified Example

Although in the first embodiment the control circuit 112 firstly sets the switch SW to the ON state, and then sets the switch SW to the OFF state after a predetermined period has elapsed from when the switch SW is set to the ON state while setting the switch SW to the ON state with the predetermined period set to the switching period information 132, it is also possible to make a modification so that the control circuit 112 firstly sets the switch SW to the OFF state, and then sets the switch SW to the ON state after a predetermined period has elapsed from when the switch SW is set to the OFF state while setting the switch SW to the OFF state with the predetermined period set to the switching period information 132. For example, it is also possible to arrange that the control circuit 112 sets the switch SW to the ON state after the period corresponding to (the characteristic vibration period of the beam 104)-(a half of the resonance period T of the LC resonance circuit) has elapsed from when the switch SW is set to the OFF state while setting the switch SW to the OFF state with the period coinciding with the characteristic vibration period of the beam 104.

Figure 25:
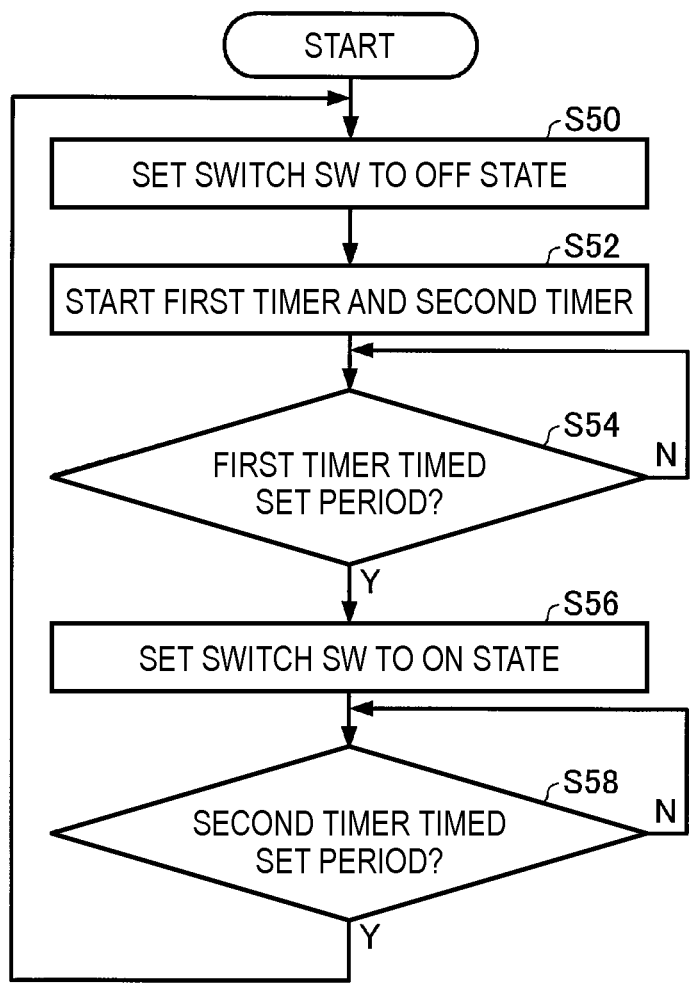
FIG. 25 is a flowchart of a switch control process in a third modified example.

FIG. 25 is a flowchart showing the switch control process of switching between the ON and OFF states of the switch SW in the present modified example. This process is performed by, for example, the CPU incorporated in the control circuit 112.

When starting the switch control process, the CPU of the control circuit 112 sets (step S50) the switch SW to the OFF state, and then starts (step S52) the first timer and the second timer not shown and incorporated in the control circuit 112. The first timer times a period set previously, specifically the period equal to (the characteristic vibration period of the beam 104)-(a half of the resonance period of the LC resonant circuit) in the present modified example. It should be noted that the set period can also be rewritably stored in the memory 130, or the set period is not necessary required to be stored in the memory 130 if it can be constant. The second timer times a period set in the switching period information 132, specifically the period coinciding with the characteristic vibration period of the beam 104 in the present modified example.

Then, the CPU of the control circuit 112 waits until the first timer times the set period (until the period equal to (the characteristic vibration period of the beam 104)-(a half of the resonance period of the LC resonant circuit) has elapsed) (N in the step S54), and then sets (step S56) the switch SW to the ON state when the first timer times the set period (Y in the step S54).

Subsequently, the CPU of the control circuit 112 waits until the second timer times the set period (until the time coinciding with the characteristic vibration period of the beam 104 has elapsed) (N in the step S58), and then sets (step S50) the switch SW to the OFF state again when the second timer times the set period (Y in the step S58), and then repeats the series of processes described above.

F-4. Fourth Modified Example

Although in the second and third embodiment, the control circuit 112 determines the timing at which the switch SW is set to the ON state based on the detection result of the vibration detection section 140, and then sets the switch SW to the ON state for the predetermined period with the predetermined period set in the switching period information 132, it is also possible to make modification so that the control circuit 112 determines the timing at which the switch SW is set to the OFF state based on the detection result of the vibration detection section 140, and then sets the switch SW to the OFF state for the predetermined period with the predetermined period set in the switching period information 132. It is also possible to arrange that the control circuit 112 sets the switch SW to the OFF state for a predetermined period (e.g., the period corresponding to (the characteristic vibration period of the beam 104)-T/2) if the deformation direction of the beam 104 fails to be switched (e.g., after the period corresponding to a half of the resonance period T of the LC resonant circuit has elapsed from the timing at which the deformation direction of the beam 104 is switched) based on the detection result of the vibration detection section 140 at a predetermined timing, and thereafter sets the switch SW to the OFF state for the predetermined period with a period coinciding with the characteristic vibration period of the beam 104.

Figure 26:
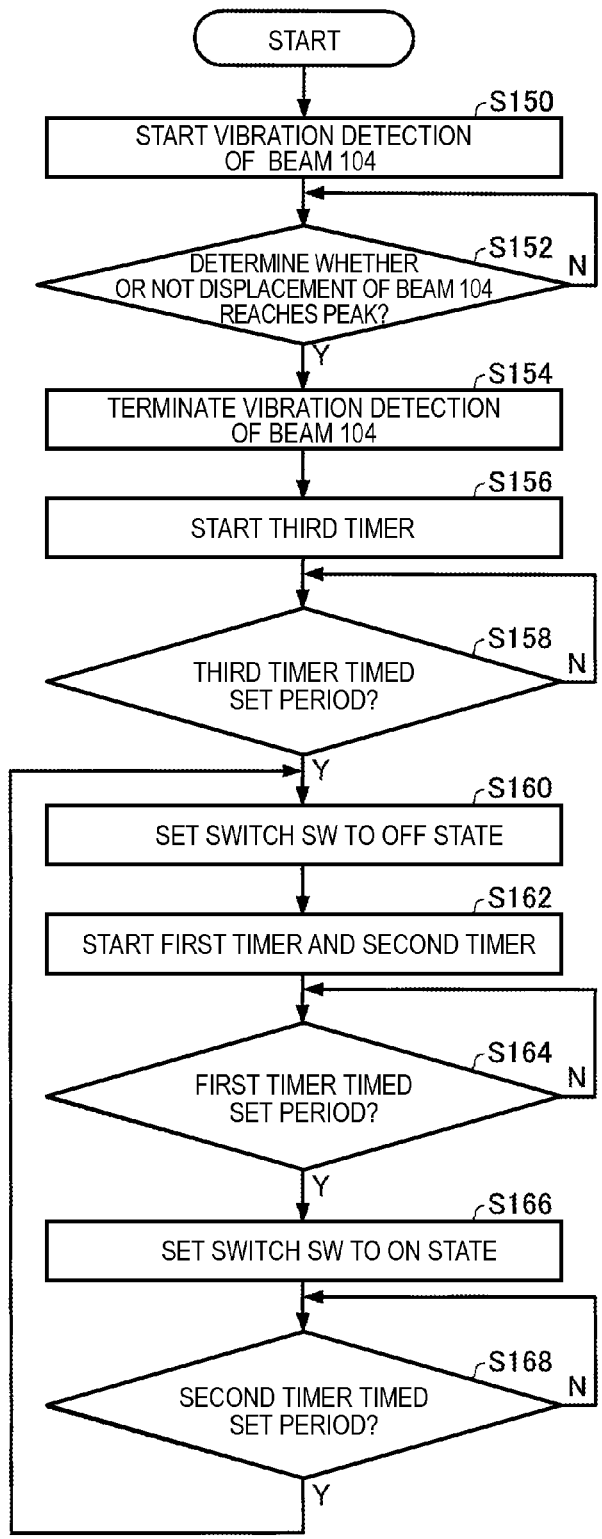
FIG. 26 is a flowchart of a switch control process in a fourth modified example.

FIG. 26 is a flowchart showing the switch control process of switching between the ON and OFF states of the switch SW in the present modified example. This process is performed by, for example, the CPU incorporated in the control circuit 112.

Firstly, the CPU of the control circuit 112 sequentially performs the process of the steps S150, S152, and S154 similarly to the steps S100, S102, and S104 of FIG. 16.

Then, the CPU of the control circuit 112 starts (step S156) the third timer. The third timer times a period set previously, specifically the period equal to a half of the resonance period of the LC resonant circuit in the present modified example. It should be noted that the set period can also be rewritably stored in the memory 130, or the set period is not necessary required to be stored in the memory 130 if it can be constant.

The CPU of the control circuit 112 waits until the third timer times the set period (until the time half as long as the resonance period of the LC resonant circuit has elapsed) (N in the step S158), and then sets (step S160) the switch SW to the OFF state when the third timer times the set period (Y in the step S158), and then starts (step S162) the first and second timers. The first timer times a period set previously, specifically the period equal to (the characteristic vibration period of the beam 104)-(a half of the resonance period of the LC resonant circuit) in the present modified example. It should be noted that the set period can also be rewritably stored in the memory 130, or the set period is not necessary required to be stored in the memory 130 if it can be constant. The second timer times a period set in the switching period information 132, specifically the period coinciding with the characteristic vibration period of the beam 104 in the present embodiment.

Then, the CPU of the control circuit 112 waits until the first timer times the set period (until the period equal to (the characteristic vibration period of the beam 104)-(a half of the resonance period of the LC resonant circuit) has elapsed) (N in the step S164), and then sets (step S166) the switch SW to the ON state when the first timer times the set period (Y in the step S164).

Subsequently, the CPU of the control circuit 112 waits until the second timer times the set period (until the time coinciding with the characteristic vibration period of the beam 104 has elapsed) (N in the step S168), and then sets (step S160) the switch SW to the OFF state again when the second timer times the set period (Y in the step S168), and then repeats the series of processes on and after the step S162 described above.

It should be noted that it is also possible to use the first timer or the second timer as the third timer in the flowchart shown in FIG. 26.

F-5. Fifth Modified Example

Similarly to the second and third embodiments, the fourth embodiment can also be modified so that the control circuit 112 determines the timing at which the switch SW is set to the OFF state based on the detection result of the vibration detection section 140, and then sets the switch SW to the OFF state for the predetermined period with the predetermined period set to the switching period information 132.

Figure 27:
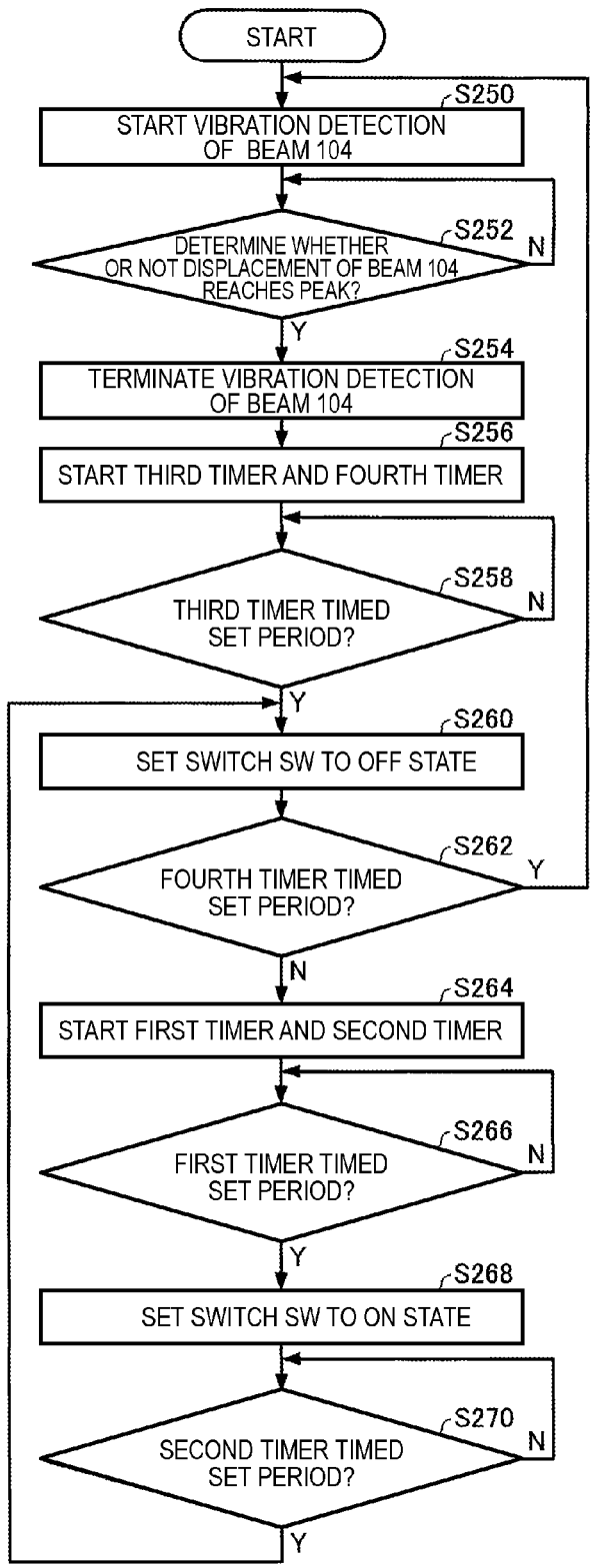
FIG. 27 is a flowchart of a switch control process in a fifth modified example.

FIG. 27 is a flowchart showing the switch control process of switching between the ON and OFF states of the switch SW in the present modified example. This process is performed by, for example, the CPU incorporated in the control circuit 112.

Firstly, the CPU of the control circuit 112 sequentially performs the process of the steps S250, S252, and S254 similarly to the steps S200, S202, and S204 of FIG. 21.

Then, the CPU of the control circuit 112 starts (step S256) the third and fourth timers. The third timer times a period set previously, specifically the period equal to a half of the resonance period of the LC resonant circuit in the present modified example. It should be noted that the set period can also be rewritably stored in the memory 130, or the set period is not necessary required to be stored in the memory 130 if it can be constant. The fourth timer times a period (e.g., several hours) set previously. The timing at which the switch SW is set to the ON state and the timing at which the deformation direction of the beam 104 is switched are shifted from each other with a certain period, and the set period is determined to be an appropriate period of time in accordance with the length of the period, frequency at which the environmental vibration stops, and so on. It should be noted that the set period can also be rewritably stored in the memory 130, or the set period is not necessary required to be stored in the memory 130 if it can be constant.

The CPU of the control circuit 112 waits until the third timer times the set period (until the time half as long as the resonance period of the LC resonant circuit has elapsed) (N in the step S258), and then sets (step S260) the switch SW to the OFF state when the third timer times the set period (Y in the step S258).

Subsequently, the CPU of the control circuit 112 determines (step S262) whether or not the fourth timer has timed the set period. If the fourth timer has not timed the set period (N in the step S262), the CPU starts (step S264) the first and second timers. The first timer times a period set previously, specifically the period coinciding with (the characteristic vibration period of the beam 104)-(a half of the resonance period of the LC resonant circuit) in the present modified example. It should be noted that the set period can also be rewritably stored in the memory 130, or the set period is not necessary required to be stored in the memory 130 if it can be constant. The second timer times a period set in the switching period information 132, specifically the period coinciding with the characteristic vibration period of the beam 104 in the present embodiment.

Then, the CPU of the control circuit 112 waits until the first timer times the set period (until the period coinciding with (the characteristic vibration period of the beam 104)-(a half of the resonance period of the LC resonant circuit) has elapsed) (N in the step S266), and then sets (step S268) the switch SW to the ON state when the first timer times the set period (Y in the step S266).

Subsequently, the CPU of the control circuit 112 waits until the second timer times the set period (until the time coinciding with the characteristic vibration period of the beam 104 has elapsed) (N in the step S270), and then sets (step S260) the switch SW to the OFF state again when the second timer times the set period (Y in the step S270), and then repeats the series of processes on and after the step 5262 described above.

In contrast, if the fourth timer has timed the set period (Y in the step S262), the CPU of the control circuit 112 sets the vibration detection section 140 to the ON state again to thereby start (step S250) the vibration detection of the beam 104, and then repeats the series of processes on and after the step S252 described above.

It should be noted that it is also possible to use the first timer or the second timer as the third timer in the flowchart shown in FIG. 27.

Although the embodiment and the modified examples are explained hereinabove, the invention is not limited to the embodiment and the modified examples described above, but can be put into practice in various forms within the scope or the spirit of the invention.

For example, in the embodiments described above, the explanation is presented assuming that the piezoelectric element 108 is attached to the beam 104 having the cantilever structure. However, the piezoelectric element 108 can be attached to any member providing the member is easily deformed in a repeated manner due to a vibration or the like. For example, the piezoelectric element 108 can be attached to a surface of a thin film, or to a side surface of a coil spring.

Further, since the power generation unit according to the embodiment of the invention generates power in accordance with the vibration or the transportation, by installing the power generation unit on a bridge, a building, or a possible landslide place, it is also possible to generate electrical power at the time of disaster such as an earthquake, and to supply the electricity to a network device such as an electronic apparatus at only the time of need (disaster).

It should be noted that the power generation unit according to the embodiment of the invention can be miniaturized, and can therefore be installed in every apparatus besides the electronic apparatus. For example, by applying the power generation unit according to the embodiment of the invention to a transportation device such as a vehicle or an electric train, it is also possible to generate power by the vibration due to the transportation, and to supply the electrical power efficiently to the equipment provided to the transportation device.

In this case, in order to cope with all of the vibrations, it is also possible to incorporate a plurality of power generation units 100 different in length of the beam 104 and weight of the mass 106 in the transportation device. For example, it is also possible to constitute a power generating unit having the plurality of power generation units 100 fixed to the base 102 common to the power generation units 100.

Further, it is also possible to incorporate the power generation unit according to the embodiment of the invention in a small-sized electronic apparatus such as a remote controller instead of the battery.

Further, the power generation unit according to the embodiment of the invention can be provided with the same shape as, for example, a button battery or a dry-cell battery, and can also be used in general electronic apparatuses instead of being installed in a specific electronic apparatus or the like. In this case, since it is possible to charge the capacitor by a vibration, the power generation unit can be used as a battery even in the time of disaster with electricity lost. Further, since the life thereof is longer than that of a primary cell, reduction of environmental load can be achieved in terms of a life cycle.

The invention includes configurations (e.g., configurations having the same function, the same way, and the same result, or configurations having the same object and the same advantages) substantially the same as those described in the embodiment section. Further, the invention includes configurations obtained by replacing a non-essential part of the configuration described in the embodiment section. Further, the invention includes configurations exerting the same functional effects or configurations capable of achieving the same object as the configuration described in the embodiment section. Further, the invention includes configurations obtained by adding technologies known to the public to the configuration described in the embodiment section.

This application claims priority to Japanese Patent Application No. 2011-219049 filed on Oct. 3, 2011,and Application No. 2012-152628 filed on Jul. 6, 2012, the entirety of which is hereby incorporated by reference.

What is claimed is:

1. A power generation unit comprising:
   a deforming member having a piezoelectric element and deforming while switching a deformation direction;
   an inductor electrically connected to the piezoelectric element;
   a switch disposed between the piezoelectric element and the inductor;
   a storage section adapted to store information including at least one of a characteristic vibration period, a dimension, and a weight of the deforming member; and
   a control section adapted to control one of a timing at which the switch is set to a conductive state and a timing at which the switch is set to a nonconductive state in accordance with the information stored in the storage section.

2. The power generation unit according to claim 1, further comprising:
   a vibration detection section adapted to detect a state of a vibration of the deforming member,
   wherein the control section performs one of a process of determining the timing at which the switch is set to the conductive state based on a detection result of the vibration detection section, and then setting the switch to the conductive state at a timing corresponding to the information stored in the storage section, and a process of determining the timing at which the switch is set to the nonconductive state based on the detection result of the vibration detection section, and then setting the switch to the nonconductive state at the timing corresponding to the information stored in the storage section.

3. The power generation unit according to claim 2, wherein the control section performs one of
   a process of setting the switch to the conductive state at a timing at which the deformation direction of the deforming member is switched based on a detection result of the vibration detection section, and then setting the switch to the conductive state at the timing corresponding to the information stored in the storage section, and
   a process of setting the switch to the nonconductive state, and then setting the switch to the nonconductive state at the timing corresponding to the information stored in the storage section if the deformation direction of the deforming member fails to be switched based on the detection result of the vibration detection section.

4. The power generation unit according to claim 2, further comprising:
   a rectifier disposed between the piezoelectric element and the inductor, and adapted to rectify a current generated by the piezoelectric element,
   wherein the vibration detection section detects a current flowing from the piezoelectric element to the rectifier.

5. The power generation unit according to claim 2, further comprising:
   a second piezoelectric element, which is different from the piezoelectric element (hereinafter also referred to as a first piezoelectric element), and is provided to the deforming member; and
   a pair of electrodes provided to the second piezoelectric element,
   wherein the vibration detection section detects a voltage between the pair of electrodes provided to the second piezoelectric element.

6. The power generation unit according to claim 2, wherein the vibration detection section detects a state of the vibration of the deforming member in an initial operation of the power generation unit.

7. The power generation unit according to claim 2, wherein the vibration detection section detects a state of the vibration of the deforming member at a timing at which an event signal is input from an outside of the power generation unit.

8. The power generation unit according to claim 2, wherein the vibration detection section detects the state of the vibration of the deforming section again when a predetermined period elapses after the state of the vibration of the deforming member is detected.

9. The power generation unit according to claim 2, wherein the control section measures the vibration period of the deforming member based on the detection result of the vibration detection section, and then updates the information of the characteristic vibration period stored in the storage section based on the measurement result.

10. The power generation unit according to claim 1, wherein
    the control section sets the switch to the conductive state for a period corresponding to a half cycle of a resonance period of a resonant circuit configured including a capacitive component of the piezoelectric element and the inductor.

11. An electronic apparatus, comprising: the power generation unit according to claim 1.

12. An electronic apparatus, comprising: the power generation unit according to claim 2.

13. An electronic apparatus, comprising: the power generation unit according to claim 3.

14. An electronic apparatus, comprising: the power generation unit according to claim 4.

15. A transportation device comprising: the power generation unit according to claim 1.

16. A transportation device comprising: the power generation unit according to claim 2.

17. A transportation device comprising: the power generation unit according to claim 3.

18. A transportation device comprising: the power generation unit according to claim 4.

19. A method of controlling a power generation unit including
- a deforming member having a piezoelectric element and deforming while switching a deformation direction,
- an inductor electrically connected to the piezoelectric element,
- a switch disposed between the piezoelectric element and the inductor, and
- a storage section adapted to store information including at least one of a characteristic vibration period, a dimension, and a weight of the deforming member, the method comprising:
- controlling one of a timing at which the switch is set to a conductive state and a timing at which the switch is set to a nonconductive state in accordance with the information stored in the storage section.

* * * * *